United States Patent
Yaegashi et al.

(10) Patent No.: US 11,181,363 B2
(45) Date of Patent: Nov. 23, 2021

(54) MEASUREMENT DEVICE, IMPRINT APPARATUS, METHOD FOR MANUFACTURING PRODUCT, LIGHT AMOUNT DETERMINATION METHOD, AND LIGHT AMOUNT ADJUSTMENT METHOD

(71) Applicant: CANON KABUSHIKI KAISHA, Tokyo (JP)

(72) Inventors: Kenji Yaegashi, Utsunomiya (JP); Toshiki Iwai, Utsunomiya (JP); Takamitsu Komaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 785 days.

(21) Appl. No.: 15/491,723

(22) Filed: Apr. 19, 2017

(65) Prior Publication Data

US 2017/0307367 A1 Oct. 26, 2017

(30) Foreign Application Priority Data

Apr. 25, 2016 (JP) .............................. JP2016-087314

(51) Int. Cl.
*G01B 11/27* (2006.01)
*G02B 27/60* (2006.01)
(Continued)

(52) U.S. Cl.
CPC ............ *G01B 11/272* (2013.01); *G02B 27/32* (2013.01); *G02B 27/60* (2013.01); *G03F 9/7042* (2013.01); *G03F 9/7088* (2013.01)

(58) Field of Classification Search
CPC .......... G03F 9/00; G03F 7/0002; G03F 7/001; G03F 7/0032; G03F 7/20; G03F 7/2004; G03F 7/2008; G03F 7/203; G03F 7/70375; G03F 7/70425; G03F 7/70433; G03F 7/70441; G03F 7/7045; G03F 7/70458; G03F 7/70466; G03F 7/70475; G03F 9/7003; G03F 9/7007; G03F 9/7011;
(Continued)

(56) References Cited

U.S. PATENT DOCUMENTS 4,560,249 A * 12/1985 Nishiwaki ................ G02B 5/32
359/3
4,640,888 A * 2/1987 Itoh ............................ G03F 9/00
257/E23.179
(Continued)

FOREIGN PATENT DOCUMENTS

CN 101427185 A 5/2009
CN 101427185 B * 3/2013
(Continued)

*Primary Examiner* — Nahida Sultana
(74) *Attorney, Agent, or Firm* — Canon U.S.A., Inc. IP Division

(57) ABSTRACT

A measurement device for measuring a relative position between alignment marks includes an illumination unit capable of illuminating the alignment marks at a plurality of wavelengths, a detection unit that detects light from the alignment marks, a processing unit that obtain the relative position between the alignment marks, and an adjustment unit that adjusts a relative amount between light amounts of the plurality of wavelengths so that a relative value between detection light amounts of light from the alignment marks falls within a predetermined range.

10 Claims, 14 Drawing Sheets

(51) Int. Cl.
*G03F 9/00* (2006.01)
*G02B 27/32* (2006.01)

(58) Field of Classification Search
CPC .... G03F 9/7019; G03F 9/7023; G03F 9/7038;
G03F 9/7042; G03F 9/7046; G03F
9/7065; G03F 9/7069; G03F 9/7073;
G03F 9/7076; G03F 9/708; G03F 9/7084;
G03F 9/7088; G03F 9/7092; G01B 11/00;
G01B 11/14; B29C 43/58; B29C
2043/5833; B29C 35/0805; B29C 43/52;
B29C 2035/0827; G02B 27/141
See application file for complete search history.

(56) References Cited

U.S. PATENT DOCUMENTS

| | | | | | |
|---|---|---|---|---|---|
| 4,734,746 | A * | 3/1988 | Ushida | ............... | G03F 7/2022 355/53 |
| 5,772,905 | A * | 6/1998 | Chou | ............... | B29C 59/022 216/44 |
| 6,157,452 | A * | 12/2000 | Hasegawa | ............... | G01D 5/347 356/401 |
| 6,632,585 | B1 * | 10/2003 | Nakamura | ............... | C07F 7/12 430/281.1 |
| 6,909,998 | B2 | 6/2005 | Hocheng | ............... | B82Y 10/00 216/44 |
| 6,954,275 | B2 * | 10/2005 | Choi | ............... | B29C 31/045 250/548 |
| 6,990,870 | B2 * | 1/2006 | Choi | ............... | B82Y 10/00 73/865.9 |
| 7,197,176 | B2 * | 3/2007 | Fukui | ............... | G06T 7/0004 382/141 |
| 7,292,326 | B2 * | 11/2007 | Nimmakayala | ............... | B82Y 10/00 356/139.01 |
| 7,322,287 | B2 * | 1/2008 | Tan | ............... | G03F 7/0002 101/28 |
| 2004/0021866 | A1 * | 2/2004 | Watts | ............... | B29C 35/0888 356/401 |
| 2004/0022888 | A1 * | 2/2004 | Sreenivasan | ............... | B29C 35/0888 425/174.4 |
| 2005/0270516 | A1 * | 12/2005 | Cherala | ............... | B82Y 10/00 355/72 |
| 2009/0108483 | A1 * | 4/2009 | Suehira | ............... | B82Y 10/00 264/40.5 |
| 2009/0170038 | A1 * | 7/2009 | Amako | ............... | G02B 5/1857 430/321 |
| 2009/0296058 | A1 * | 12/2009 | Slotboom | ............... | G03F 7/70516 355/53 |
| 2010/0195102 | A1 | 8/2010 | Den Boef | | |
| 2011/0206852 | A1 * | 8/2011 | Shiode | ............... | B82Y 10/00 427/356 |
| 2011/0273684 | A1 * | 11/2011 | Owa | ............... | B29C 43/003 355/53 |
| 2011/0278768 | A1 * | 11/2011 | Sato | ............... | B82Y 10/00 264/406 |
| 2012/0328725 | A1 | 12/2012 | Minoda | | |
| 2013/0093113 | A1 * | 4/2013 | Hayashi | ............... | G03F 7/0002 264/40.1 |
| 2013/0100459 | A1 | 4/2013 | Iwai | | |
| 2013/0112097 | A1 * | 5/2013 | Nakagawa | ............... | G03F 7/0002 101/483 |
| 2015/0013559 | A1 * | 1/2015 | Hayashi | ............... | G03F 7/0002 101/450.1 |
| 2015/0377614 | A1 * | 12/2015 | Sato | ............... | G03F 7/0002 264/40.1 |
| 2016/0070175 | A1 * | 3/2016 | Akamatsu | ............... | G01B 11/272 355/67 |
| 2016/0297117 | A1 * | 10/2016 | Sato | ............... | B29C 43/52 |

FOREIGN PATENT DOCUMENTS

| | | |
|---|---|---|
| JP | H09-293674 A | 11/1997 |
| JP | 2006-516065 A | 6/2006 |
| JP | 2011-040523 A | 2/2011 |
| JP | 2011181944 | 9/2011 |
| JP | 2012-073188 A | 4/2012 |
| JP | 2012-235065 A | 11/2012 |
| JP | 2015-053404 A | 3/2015 |
| JP | 2015-130384 A | 7/2015 |
| KR | 10-1996-0032098 A | 4/1998 |
| KR | 10-2004-0000971 A | 7/2005 |
| KR | 10-2013-0044149 A | 5/2013 |
| TW | 201033751 A | 9/2010 |

* cited by examiner

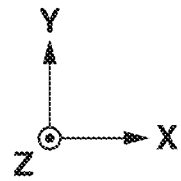

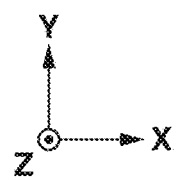

FIG.8
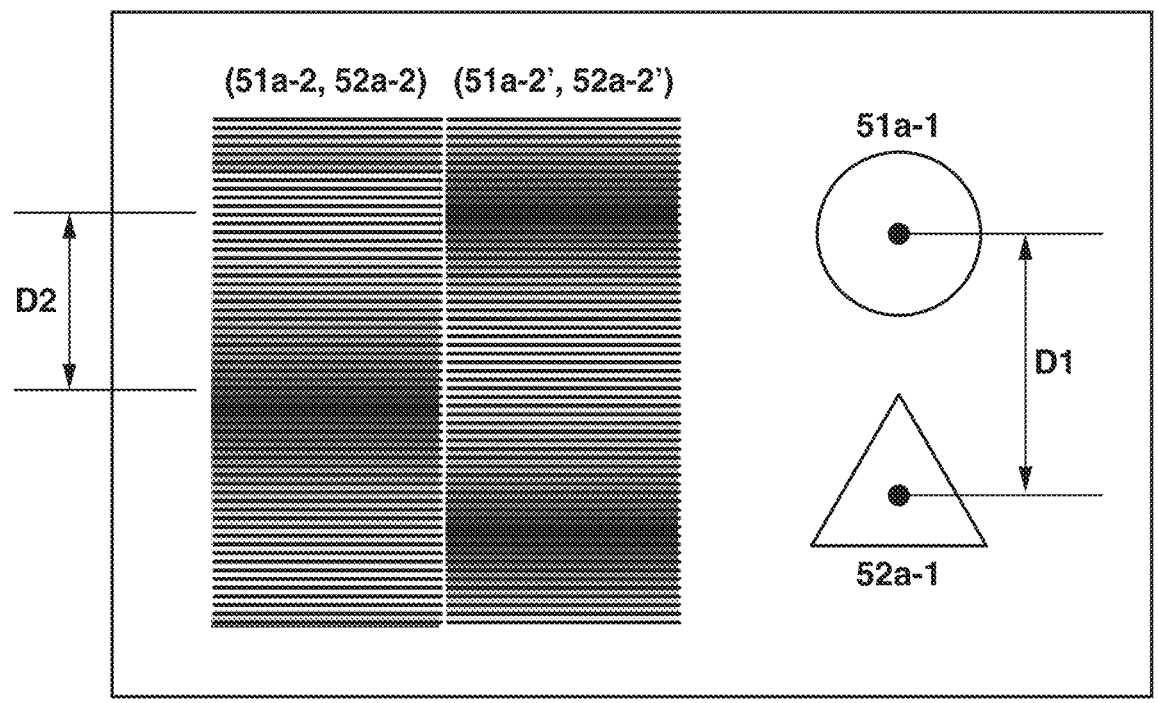
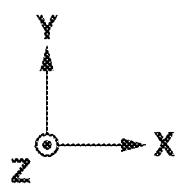

MEASUREMENT DEVICE, IMPRINT APPARATUS, METHOD FOR MANUFACTURING PRODUCT, LIGHT AMOUNT DETERMINATION METHOD, AND LIGHT AMOUNT ADJUSTMENT METHOD

BACKGROUND OF THE INVENTION

Field of the Invention

The aspect of the disclosure relates to a measurement device, an imprint apparatus, a method for manufacturing a product, a light amount determination method, and a light amount adjustment method.

Description of the Related Art

Demand for miniaturization of semiconductor devices and micro electromechanical systems (MEMS) has been growing. Microfabrication techniques for molding an imprint material on a substrate with a mold to form a pattern of the imprint material on the substrate are attracting attention. Such techniques are called imprint techniques. The imprint techniques can form a fine structure of the order of several nanometers on a substrate.

Among examples of the imprint techniques, there is a light curing method. An imprint apparatus using the light curing method initially supplies (applies) an uncured imprint material to a shot area of a substrate. A mold is then brought into contact with (pressed against) the uncured imprint material supplied to the shot area for molding. In a state where the imprint material and the mold in contact with each other, the imprint apparatus then irradiates the imprint material with light (e.g., ultraviolet rays) to cure. The cured imprint material is released from the mold, whereby a pattern of the imprint material is formed on the substrate.

In performing such a process, the imprint apparatus needs to align the mold and the substrate. Japanese Patent Application Laid-Open No. 2011-181944 discusses a method for bringing a mold and a substrate into contact with each other with an imprint material interposed therebetween, and aligning the mold and the substrate. The imprint material is initially applied to the substrate except where alignment marks are provided. Next, the substrate is moved to a position opposing the mold. The distance between the mold and the substrate is then reduced to such a height that the alignment marks are not buried under the imprint material. In such a state, alignment marks provided on the mold and the alignment marks provided on the substrate are detected to measure relative positions between the alignment marks. The mold and the substrate are aligned based on the measurement results. The mold and the substrate are then pressed against each other.

Japanese Patent Application Laid-Open. No. 2011-181944 discusses a measurement device for measuring a relative position between marks, in which the wavelength of incident on an image sensor is selected according to a gap between the mold and the substrate and a film thickness of the marked portions of the mold. The reason is that a light amount of the light reflected from the marks according to the gap between the mold and the substrate changes differently depending on the wavelength.

Japanese Patent Application Laid-Open No. 2011-181944 discusses selective use of the wavelength in detecting a pair of alignment marks including one on the mold and one on the substrate.

A plurality of types of marks may be used as the alignment marks. Examples include marks between which a relative position is measured with low measurement accuracy, and ones between which a relative position can be measured with higher measurement accuracy. The reflectance of a mark can vary depending on a material, a pattern shape, and a thickness of the mark, and the presence or absence of a process layer formed on the mark. If the marks have different reflectances, there arises a difference between detection light amounts of the light from the plurality of types of marks. A measurement signal of a relative position between at least one type of marks may therefore fail to be accurately detected. As a result, the measurement accuracy of the relative position between the marks may be deteriorated.

SUMMARY OF THE INVENTION

According to an aspect of the disclosure, a measurement device includes an illumination unit for emitting light including illumination light having a first wavelength and illumination light having a second wavelength, and configured to illuminate a first alignment mark provided on the first member and a second alignment mark provided on the second member and illuminate a third alignment mark provided on the first member and a fourth alignment mark provided on the second member, a detection unit configured to detect light from the first and second alignment marks and light from the third and fourth alignment marks, a processing unit configured to obtain a relative position between the first and second alignment marks based an the detected light from the first and second alignment marks, and a relative position between the third and fourth alignment marks based on the detected light from the third and fourth alignment marks, and an adjustment unit configured to adjust a relative amount between a light amount of illumination light having the first wavelength and a light amount of illumination light having the second wavelength so that a relative value between a detection light amount of the light from the first and second alignment marks detected by the detection unit and a detection light amount of the light from the third and fourth alignment marks detected by the detection unit falls within a predetermined range.

Further features of the disclosure will become apparent from the following description of exemplary embodiments with reference to the attached drawings.

BRIEF DESCRIPTION OF THE DRAWINGS

FIG. 8 is a diagram illustrating an image of moiré patterns and rough examination marks.

DESCRIPTION OF THE EMBODIMENTS

Exemplary embodiments of the disclosure will be described in detail below with reference to the accompanying drawings.

Figure 1:
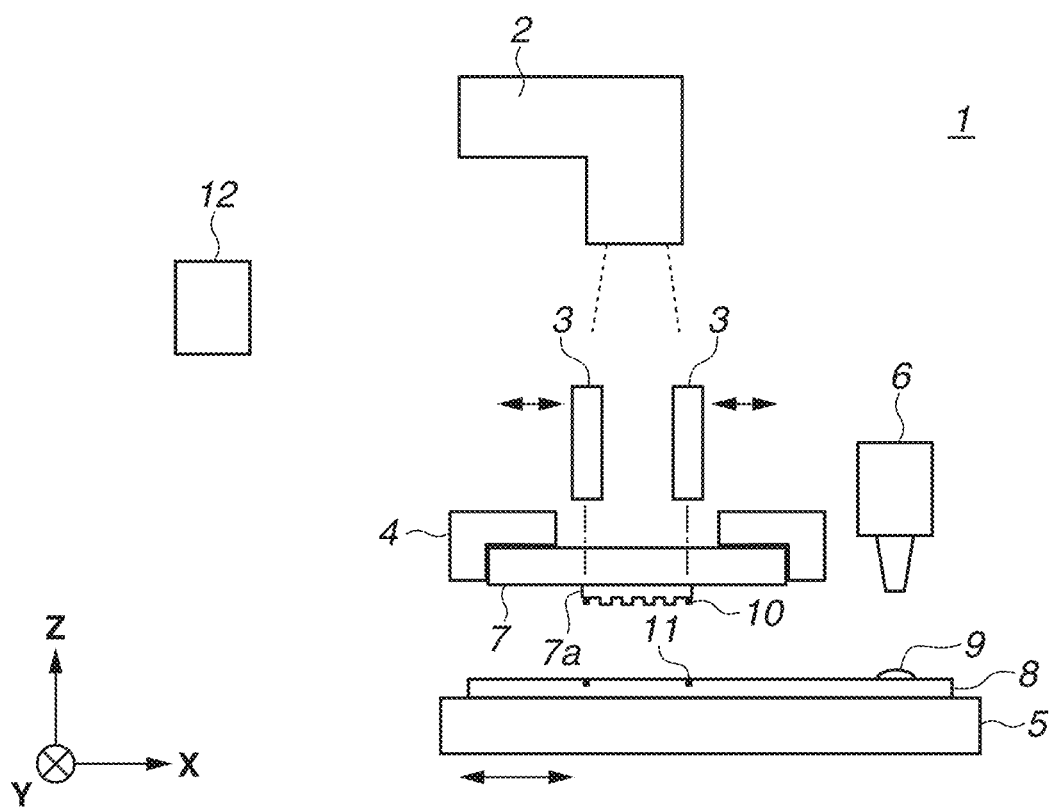
FIG. 1 is a diagram illustrating a representative configuration example of an imprint apparatus.

First, a configuration of an imprint apparatus according to a first exemplary embodiment will be described. FIG. 1 is a diagram illustrating a representative configuration of an imprint apparatus 1 according to the present exemplary embodiment. The imprint apparatus 1 is an apparatus for forming a pattern of a cured material, to which a concave and convex pattern of a mold is transferred, on a substrate by bringing an imprint material supplied on the substrate into contact with the mold and giving the imprint material energy for curing.

A curable composition (may also be referred to as uncured resin), which cures when energy for curing is given, is used as the imprint material. Examples of the energy for curing include electromagnetic waves and heat. Examples of the electromagnetic waves include infrared rays, a visible light beam, and ultraviolet rays of which a wavelength is selected from a range of longer than or equal to 10 nm and not longer than 1 mm.

The curable composition is a composition that cures when irradiated with light or heated. A photocurable composition which cures by light contains at least a polymerizable compound and a photopolymerization initiator. The photocurable composition may contain a nonpolymerizable compound or compounds and/or a solvent if needed. The nonpolymerizable compound is at least one selected from a group including sensitizers, hydrogen donors, internal mold releasing agents, surface active agents, antioxidants, and polymer components.

The imprint material is applied in a film-like form onto the substrate by a spin coater or a slit coater. Alternatively, a liquid spray head may be used to apply the imprint material onto the substrate in liquid droplets or in the form of islands or a film made of a plurality of liquid droplets joined together. The imprint material may have a viscosity (viscosity at 25° C.) of higher than or equal to 1 mPa·s and not higher than 100 mPa·s, for example.

The substrate may be made of glass, ceramic, metal, semiconductor, or resin. A member or members made of material different from that of the substrate may be formed on the surface, if needed. Specific examples of the substrate include a silicon wafer, a compound semiconductor wafer, and quartz glass.

The imprint apparatus 1 according to the present exemplary embodiment uses a light curing method. In FIG. 1, X- and Y-axes orthogonal to each other are assumed within a plane parallel to the substrate surface. A Z-axis is assumed in a direction perpendicular to the X- and Y-axes. The imprint apparatus 1 includes an irradiation unit 2, measurement devices 3, a mold holding unit 4, a wafer stage 5, an application unit 6, and a control unit 12.

The irradiation unit 2 is an irradiation apparatus for irradiating a mold 7 and an imprint material on a wafer (substrate) 8 with ultraviolet rays to cure the imprint material after stamping processing of bringing the mold 7 and the imprint material into contact with each other. The irradiation unit 2 includes a light source for emitting the ultraviolet rays, and a plurality of optical elements for uniformly irradiating the mold 7 and the imprint material with the ultraviolet rays emitted from the light source in a predetermined shape. In particular, the light irradiation area (irradiation range) of the irradiation unit 2 may be substantially the same as the surface area of a concave and convex pattern 7a of the mold 7, or slightly greater than the surface area of the concave and convex pattern 7a. The purpose thereof is to minimize the irradiation area so that expansion of the mold 7 or the wafer 8 due to heat caused by the irradiation is suppressed to avoid a positional deviation or distortion of the pattern transferred to the imprint material. Another purpose thereof is to prevent the ultraviolet rays reflected by the wafer 8 from reaching the application unit 6 and curing the imprint material remaining an a discharge portion of the application unit 6 to cause abnormality in subsequent operations of the application unit 6. Examples of the usable light source include a high pressure mercury lamp, various types of excimer lamps, an excimer laser, and a light-emitting diode. The light source is appropriately selected according to the characteristics of the imprint material to be irradiated. The types, number, and wavelengths of light sources are not limited in particular.

The mold 7 is a mold having a predetermined pattern (e.g., the concave and convex pattern 7a such as a circuit pattern) three-dimensionally formed on its surface opposing the wafer 8. The mold 7 may be made of material such as quartz which can transmit ultraviolet rays.

The mold holding unit 4 is a mold holding unit for attracting and holding the mold 7 by vacuum suction force or electrostatic force. The mold holding unit 4 includes a mold chuck, a mold driving mechanism, and a mold magnification correction mechanism. The mold driving mechanism moves the mold chuck in the Z-axis direction. The mold magnification correction mechanism deforms the mold 7 in the and Y-axis directions to correct distortion of the pattern transferred onto the imprint material. The mold driving mechanism is provided to press the mold 7 against an ultraviolet-curing imprint material applied onto the wafer 8. Mold pressing and releasing operations of the imprint apparatus 1 may be implemented by moving the mold 7 in the Z-axis direction in such a manner. Alternatively, for example, the mold pressing and releasing operations may be implemented by moving the wafer stage 5 (wafer 8) in the Z-axis direction. Both the mold 7 and the wafer stage 5 may be moved.

The wafer stage 5 is a substrate holding unit which can hold the wafer 8 by vacuum suctioning, for example, and move the wafer 8 within an XY plane. An example of the wafer 8 is a substrate made of monocrystalline silicon. An ultraviolet-curing imprint material 9 to be molded by the mold 7 is applied to a surface to be processed of the substrate.

The imprint apparatus 1 includes the measurement devices 3 for performing measurement of relative alignment between the wafer 8 and the mold 7 (a first member and a second member). The measurement unit devices 3 optically detect alignment marks 10 provided on the mold 7 and alignment marks 11 provided on the wafer 8, and measure relative positions between the alignment marks 10 and 11. The measurement devices 3 are configured to be movable in the X- and Y-axis directions according to the positions of the alignment marks provided on the mold 7 or the wafer 8. To focus on the positions of the alignment marks 10 and 11, the measurement unit devices 3 also configured to be movable in the Z-axis direction.

The control unit 12 is electrically connected to the irradiation unit 2, the measurement devices 3, the mold holding unit 4, the wafer stage 5, and the application unit 6, and transmits control commands thereto and obtains information therefrom. For example, the control unit 12 obtains information about relative positions between the alignment marks 10 and 11 measured by the measurement devices 3, and controls the driving of the wafer stage 5 and the mold magnification correction mechanism (alignment unit) of the mold holding unit 4 based on the information. The measurement devices 3 and the alignment marks 10 and 11 will be described in detail below.

The application unit 6 is an application unit for applying the imprint material 9 onto the wafer 8. The imprint material 9 is a photocurable imprint material having the characteristic of curing by receiving ultraviolet rays. The imprint material 9 is appropriately selected depending on the type of semiconductor device. In FIG. 1, the application unit 6 is included inside the imprint apparatus 1. The application unit 6 may be installed outside the imprint apparatus 1, not inside the imprint apparatus 1. If the application unit 6 is installed outside, the wafer 8 to which the imprint material 9 is applied by the application unit 6 in advance is introduced into the imprint apparatus 1. According to such a configuration, the absence of the application step in the imprint apparatus 1 enables faster processing by the imprint apparatus 1.

Next, imprint processing by the imprint apparatus 1 will be described. First, the wafer 8 is conveyed onto the wafer stage 5 by a not-illustrated substrate conveyance unit. The wafer 8 is placed on and fixed to the wafer stage 5. Next, the wafer stage 5 is moved to an application position of the application unit 6. Then, as an application step, the application unit 6 applies the imprint material 9 to a predetermined shot (imprint) area of the wafer 8. Next, the wafer stage 5 is moved so that the applied surface of the wafer 8 comes directly below the mold 7. Then, the mold driving mechanism is driven to press the mold 7 against the imprint material 9 on the wafer 8 (stamping step). At that time, the stamping of the mold 7 makes the imprint material 9 flow along the concave and convex pattern 7a formed on the mold 7. The measurement devices 3 detect the alignment marks 10 and 11 provided on the wafer 8 and the mold 7. The wafer stage 5 is driven for alignment between the stamping surface of the mold 7 and the applied surface of the wafer 8. The mold magnification correction mechanism performs magnification correction on the mold 7. Through these operations, the imprint material 9 has fully flowed to the concave and convex pattern 7a, and the alignment between the mold 7 and the wafer 8 and the magnification correction on the mold 7 are completed. In such a state, the irradiation unit 2, as an irradiation step, irradiates the back surface (top surface) of the mold 7 with ultraviolet rays so that the imprint material 9 is cured by the ultraviolet rays transmitted through the mold 7. At this time, the measurement devices 3 are located in positions not to block the optical path of the ultraviolet rays. The mold driving mechanism is then driven again to release the mold 7 and the wafer 8 (mold releasing step). With such steps, the concave and convex pattern 7a of the mold 7 is transferred to the wafer 8.

Figure 2:
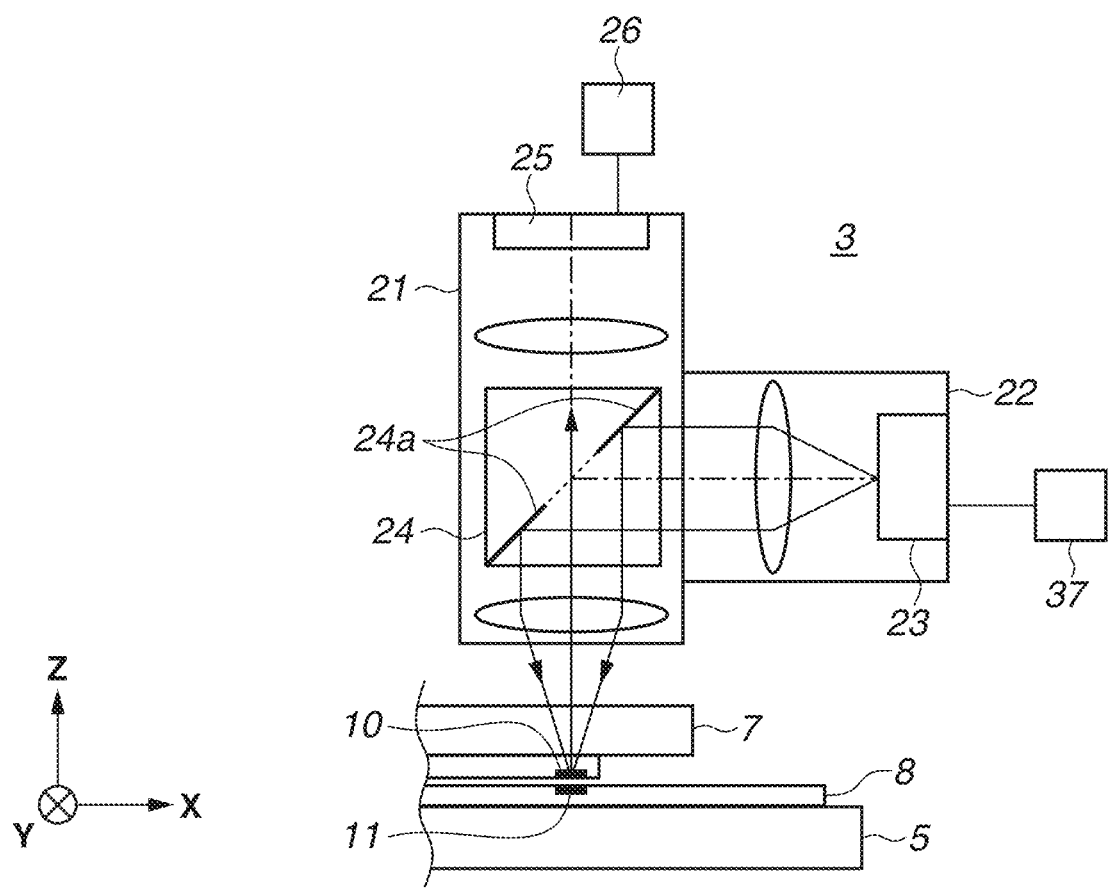
FIG. 2 is a diagram illustrating an example of a configuration of a measurement device.

Next, details of the measurement devices 3 and the alignment marks 10 and 11 respectively provided on the mold 7 and the wafer 8 will be described. FIG. 2 is a diagram illustrating an example of a configuration of the measurement devices 3 according to the present exemplary embodiment. A measurement device 3 includes a detection optical system (detection unit) 21, an illumination optical system (illumination unit) 22, a processing unit 26, and a control unit 37. The illumination optical system 22 guides light from a light source 23 to the same optical axis as that of the detection optical system 21 by using a prism 24, and illuminates the alignment marks 10 and 11. Examples of the light source 23 include a halogen lamp, a light-emitting diode (LED), a semiconductor laser (laser diode (LD)), a high pressure mercury lamp, and a metal halide lamp. The light source 23 is configured to emit a visible light beam or infrared rays not including ultraviolet rays for curing resist. The control unit 37 controls driving of the light source 23. The detection optical system 21 and the illumination optical system 22 are configured to share some of their constituent optical members. The prism 24 is arranged on or near the pupil planes of the detection optical system 21 and the illumination optical system 22. The alignment marks 10 and 11 include diffraction gratings, for example. The detection optical system 21 forms, on an image sensor 25 (sensor), an image of an interference pattern (moiré pattern) produced by interference of the diffracted light beams from the alignment marks 10 and 11 illuminated by the illumination optical system 22. Examples of the image sensor 25 include a charge-coupled device (CCD) image sensor and a complementary metal-oxide-semiconductor (CMOS) image sensor. The processing unit 26 acquires and processes image data captured by the image sensor 25. Since the interference pattern (moiré pattern) is produced by the diffracted light from the alignment marks 10 and 11 on the mold and the wafer 8, a light amount of the obtained moiré pattern varies depending on the diffraction efficiency of the mold 7 and the wafer 8. The diffraction efficiency changes periodically depending on wavelength. At some wavelengths, the moiré pattern can be detected with high efficiency. At some wavelengths, the moiré pattern is difficult to detect. Light having a wavelength at which the moiré pattern is difficult to detect can be noise to a measurement signal detected by the image sensor 25. The processing unit 26 is part of the control unit 12. The processing unit 26 obtains information about the image captured by the image sensor 25, and determines a relative position between the alignment marks 10 and 11 by calculation based on the image. The control unit 12 of the measurement device 3 controls the alignment unit based on the determined relative position, and performs alignment so as to reduce a relative positional deviation of an area including at least the alignment marks 10 and 11. In such a manner, the substrate pattern and the mold pattern can be registered with high accuracy.

The prism 24 includes a reflection film 24a on its bonding surface. The reflection film 24a is intended to reflect light in a peripheral part of the pupil plane of the illumination optical system 22. The reflection film 24a also functions as an aperture stop for defining the pupil size or a detection numerical aperture (NA) of the detection optical system 21. The prism 24 may be a half prism having a semitransparent film on its bonding surface. A plate-shaped optical element having a reflection film formed on the surface may be used instead of a prism. The area of the reflection film 24a in the periphery part of the prism 24 may be configured as a transmitting portion, and the central part of the present 24 as a reflecting portion. In other words, the positions of the light source 23 and the image sensor 25 may be switched.

Figure 3:
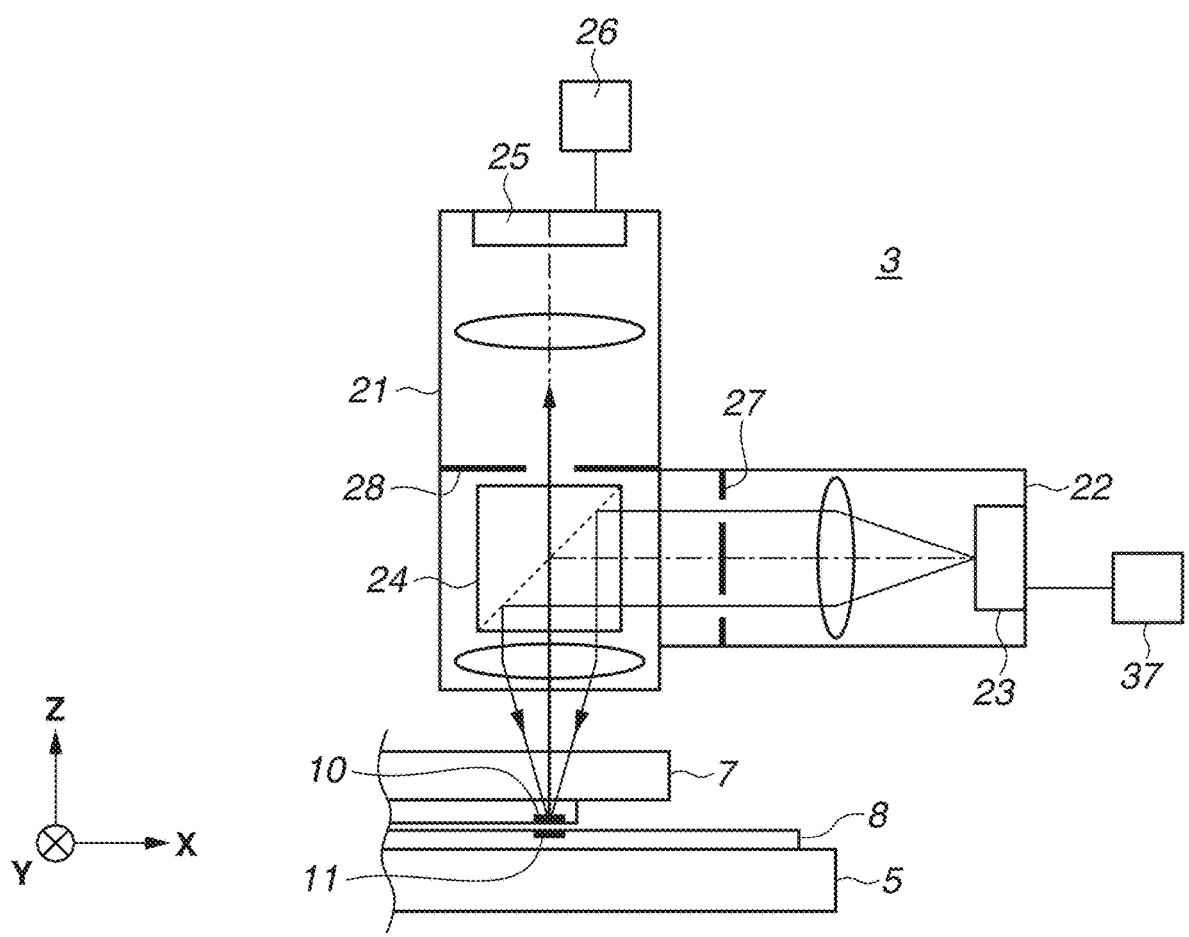
FIG. 3 is a diagram illustrating a modification of the configuration of the measurement device.

A light intensity distribution on the pupil plane of the illumination optical system 22 according to the present exemplary embodiment and the position to define the detection NA of the detection optical system 21 do not necessarily be located at the position of the prism 24. For example, as illustrated in FIG. 3, the detection optical system 21 and the illumination optical system 22 may include separate aperture stops 28 and 27, respectively. In such a configuration, the aperture shape of the aperture stop 28 defines the detection NA of the detection optical system 21. The aperture shape of the aperture stop 27 determines the light intensity distribution on the pupil plane of the illumination optical system 22. A half prism having a semitransparent film on its bonding surface may be used as the prism 24.

Figure 4:
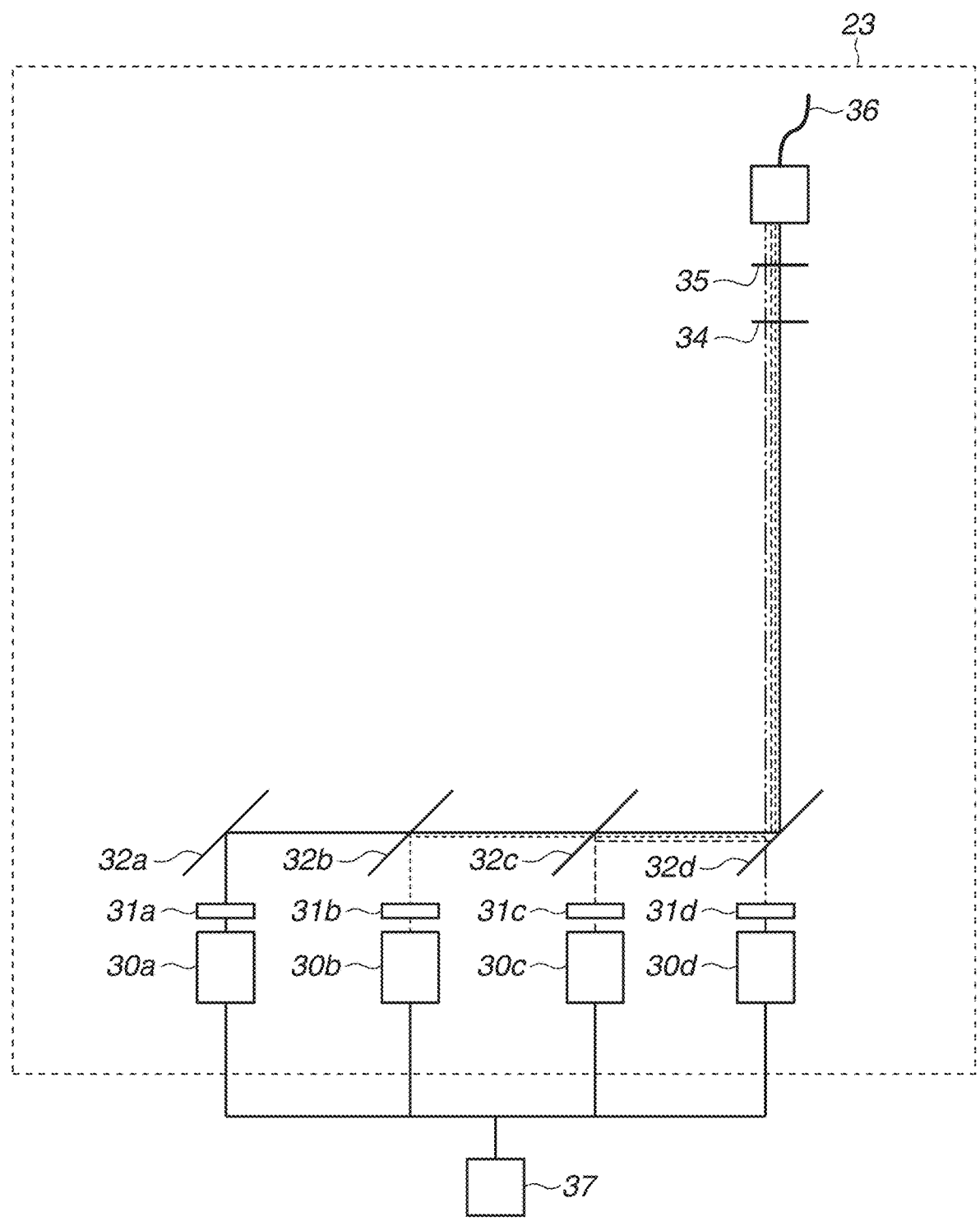
FIG. 4 is a diagram illustrating a configuration example of a light source.

Next, the light source 23 will be described. FIG. 4 is a diagram illustrating a detailed configuration of the light source 23. The light source 23 includes a plurality of light sources 30a, 30b, 30c, and 30d (30a to 30d). The plurality of light sources 30a to 30d is illustrated to be semiconductor lasers. However, it is not limited thereto. The plurality of light sources may be LEDs, halogen lamps, metal halide lamps, high pressure mercury lamps, or sodium vapor lamps. Such light sources may be used in combination. The plurality of light sources 30a to 30d is configured to emit light at different wavelengths from each other. For example, the first light source 30a emits light having a first wavelength. The second light source 30b emits light having a second wavelength different from the first wavelength. The first light source 30a may emit light having a first wavelength band, and the second light source 30b may emit light having a second wavelength band different from the first wavelength band. To increase the amount of light at a specific wavelength (band), some of the plurality of light sources 30a to 30d may be configured to emit light at the same wavelength (band). In addition, the numbers of light sources and wavelengths (wavelength bands) are not limited to four.

Optical systems 31a, 31b, 31c, and 31d (31a to 31d) are lenses, for example. The optical systems 31a to 31d are respectively provided corresponding to the respective plurality of light sources 30a to 30d. The optical systems 31a to 31d shape the light emitted from the respective plurality of light sources 30a to 30d into a desired state (shape). The light past the optical systems 31a to 31d is reflected by or transmitted through optical elements 32a, 32b, 32c, and 32d (32a to 32d) and combined into a single light beam. Examples of the optical elements 32a to 32d include dichroic mirrors and half mirrors. If the plurality of light sources 30a to 30d used for the combination of light has wavelengths different by approximately 50 nm or more from each other, dichroic mirrors can be used for combination. If the plurality of light sources 30a to 30d for the combination of light has the same or similar wavelengths and is therefore not able to be efficiently combined by dichroic mirrors, half mirrors are used for the combination of light. In FIG. 4, the plurality of light sources 30a to 30d is combined in series. However, the light sources 30a to 30d may be combined in twos in parallel. The combination method may be selected in consideration of the types and wavelengths of the light sources 30a to 30d and in consideration of space. The plurality of light sources 30a to 30d is connected with the control unit (changing unit) 37 for driving the light sources 30a to 30d. The control unit 37 can change driving currents and applied voltages of the plurality of light sources 30a to 30d to individually change output energy of the light sources 30a to 30d (amounts of light from the light sources 30a to 30d). A control unit may be provided for each light source.

The light combined by the optical elements 32a to 32d is passed through a neutral density (ND) filter 34 for light amount adjustment. The ND filter 34 is an element capable of adjusting the intensity of light to pass. For example, a type and/or thickness of a metal film applied to quartz can change the amount of transmitted light. To adjust the light amount of the light source 23, a plurality of types of filters having different transmittances is prepared as ND filters 34. The ND filter 34 inserted in the optical path is switched according to the required light amount. A filter of such a type that the transmittance changes continuously depending on the position where the light passes through the filter may be used. The ND filter 34 adjusts the light amount of the light obtained by combining the light from the light sources 30a to 30d.

The light past the ND filter 35 is transmitted through a diffusion plate 35 and guided to a fiber 36. Semiconductor lasers have a wavelength band as narrow as several nanometers and can cause noise (speckle noise) by interference on an image to be observed. The diffusion plate 35 is therefore rotated to temporally change the state of the waveforms for the sake of reducing speckle noise to be observed. The light emitted from the fiber 36 is the light emitted from the light source 23.

ND filters (changing units) capable of changing the amount of transmitted light may be arranged respectively corresponding to the plurality of light sources 30a to 30d, in the corresponding optical paths before the light emitted from each light source is combined with the light from the others. Filters of such a type that the transmittance changes continuously depending on the position where the light passes through the filters may be used as the ND filters. A plurality of types of filters having different transmittances from each other may be prepared, and the filters inserted into the optical paths may be switched according to the required amounts of transmitted light. The light combined by the optical elements 32a to 32d may be spectrally dispersed y a diffraction grating, and the light amounts of light having respective wavelengths may be adjusted by adjusting the light amount distribution of the dispersed light by using an ND filter of which the amount of transmitted light changes with position.

Figure 5:
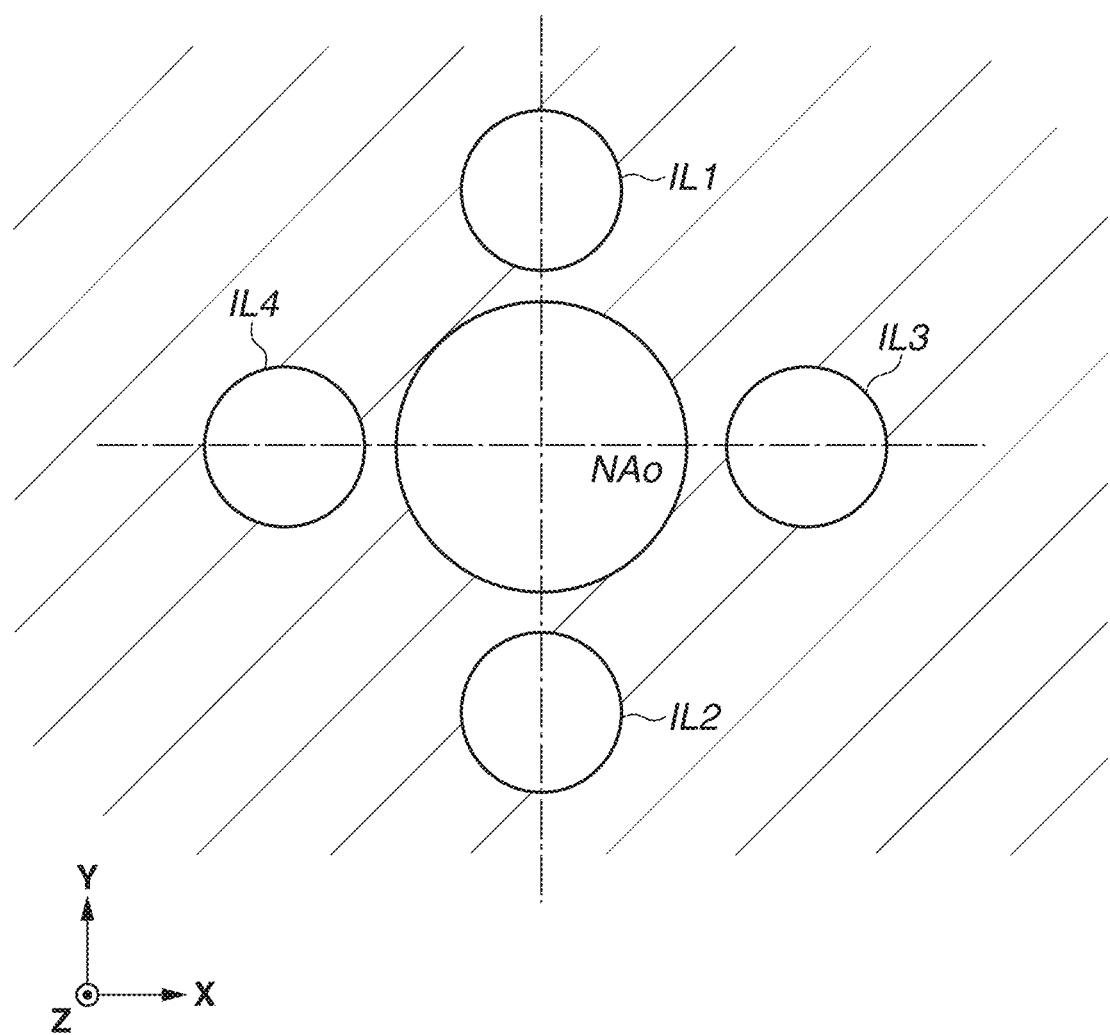
FIG. 5 is a diagram illustrating a light intensity distribution on a pupil plane of an illumination optical system.

FIG. 5 is a diagram illustrating a relationship between light intensity distributions (IL1, IL2, IL3, and IL4) on the pupil plane of the illumination optical system 22 of the measurement device 3 and a detection aperture $NA_O$ on the pupil plane of the detection optical system 21. In FIG. 5, the pupil plane (aperture stop 27) of the illumination optical system 22 and the aperture (aperture stop 28) in the pupil plane of the detection optical system 21 are illustrated so as to overlap each other. In the present exemplary embodiment, the light intensity distribution on the pupil plane of the illumination optical system 22 includes a first pole IL1, a second pole IL2, a third pole IL3, and a fourth pole IL4, which are light intensity distributions of circular configuration. Each pole includes a peak of light intensity in the pole. The illumination optical system 22 illuminates the alignment marks 10 and 11 with such poles IL1 to IL4 by using light obliquely incident in a direction perpendicular to a periodic direction (first direction) of the diffraction gratings of the alignment marks 10 and 11 and light obliquely incident in a direction parallel to the periodic direction. Since the aperture stop 27 is arranged on the pupil plane of the illumination optical system 22 as described above, a plurality of poles (first pole IL1 to fourth pole IL4) can be formed by the single light source 23. If a light intensity distribution having a plurality of poles (peaks) is thus formed from light from one light source, the measurement device 3 can be simplified or reduced in size.

Figure 6A:
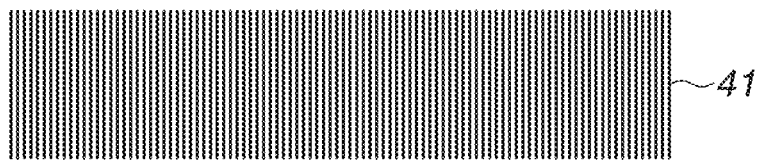
FIG. 6A is a diagram illustrating a diffraction grating provided a mold.
Figure 6B:
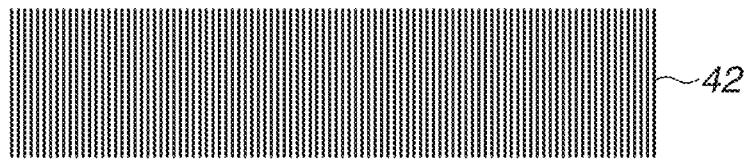
FIG. 6B is a diagram illustrating a diffraction grating provided on a substrate.

The principle of the generation of a moiré by diffracted light from diffraction grating marks and the measurement of a relative position between the marks (mold 7 and substrate 8) using the moiré will be described with reference to FIGS. 6A, 6B, 6C, and 6D. FIG. 6A illustrates a diffraction grating 41 provided on the mold 7, which corresponds to the alignment mark 10. FIG. 6B illustrates a diffraction grating 42 provided on the substrate 8, which corresponds to the alignment mark 11. The diffraction gratings 41 and 42 have periodic patterns (gratings) of slightly different periods. If two diffraction gratings having respective different grating periods are brought close to and overlapped on each other, diffracted light beams from the two diffraction gratings interfere with each other to produce a pattern, called moiré, which has a period reflecting a period difference between the diffraction gratings. The moiré changes in phase according to a relative position between the diffraction gratings. A moiré can thus be detected to determine a relative position between the diffraction gratings 41 and 42, i.e., a relative position between the mold 7 and the substrate 8.

Figure 6C:
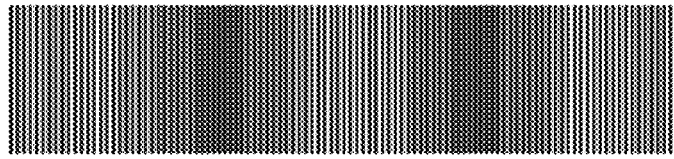
FIGS. 6C and 6D are diagrams illustrating moiré patterns.
Figure 6D:
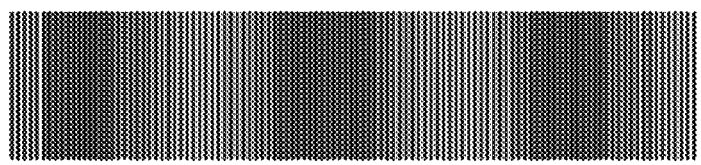

More specifically, if the diffraction gratings 41 and 42 having slightly different periods are overlapped, the diffracted light beams from the diffraction gratings 41 and 42 overlap to produce a moiré having a period reflecting the period difference as illustrated in FIG. 6C. As described above, the bright and dark positions (pattern phase) of the moiré vary with a relative position between the diffraction gratings 41 and 42. For example, if either one of the diffraction gratings 41 and 42 is moved in the X direction, the moiré illustrated in FIG. 6C changes to one illustrated in FIG. 6D. The moiré magnifies the actual amount of a positional deviation between the diffraction gratings 41 and 42 and appears as a pattern of greater period. Therefore, the relative position between the diffraction gratings 41 and 42 can be detected with high accuracy even if the detection optical system 21 has low resolution.

For such moiré detection, a case is considered in which the diffraction gratings 41 and 42 are detected in a bright field of view (the diffraction gratings 41 and 42 are perpendicularly illuminated, and diffracted light beams perpendicularly diffracted by the diffraction gratings 41 and 42 are detected). In such a case, the detection optical system 21 detects even zeroth-order light from the diffraction gratings 41 and 42. The zeroth-order light causes a reduction in the contrast of the moiré. Therefore, the measurement device 3 is configured not to detect the zeroth-order light, i.e., have a dark field of view configuration for illuminating the diffraction gratings 41 and 42 with obliquely incident light.

Figure 7A:
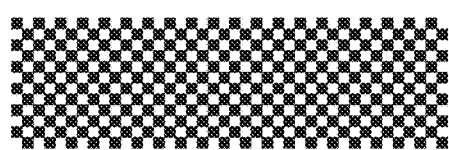
FIG. 7A is a diagram illustrating a checkerboard-like first diffraction grating.
Figure 7B:
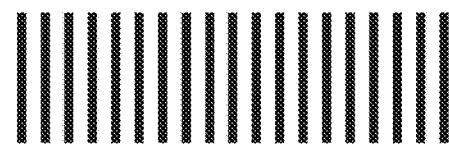
FIG. 7B is a diagram illustrating a second diffraction grating.

In the present exemplary embodiment, to detect moiré with the dark field of view configuration, either one of the alignment marks 10 and 11 is configured to include a checkerboard-like first diffraction grating such as illustrated in FIG. 7A. The other is configured to include a second diffraction grating such as illustrated in FIG. 7B. The first diffraction grating is a diffraction grating that is periodic in both an X direction (first direction) and a direction (second direction) orthogonal to the direction. The second diffraction grating is a diffraction grating that is periodic in the X direction (first direction) and has a period different from that of the first diffraction grating in the X direction. The first and second directions are not limited to orthogonal ones, and it is only required to be mutually different for the purpose of measurement.

The first diffraction grating is irradiated with the light from the first and second poles IL1 and IL2 illustrated in FIG. 5, obliquely incident in the Y direction. The light is diffracted in the Y and X directions by the first diffraction grating, and diffracted the Y direction by the second diffraction grating having a slightly different period. Such diffracted light carries relative position information about the first and second diffraction gratings in the X direction. The diffracted light is incident an the detection area (NA$_O$) on the pupil plane of the detection optical system 21 illustrated in FIG. 5, and detected as a moiré by the image sensor 25. The processing unit 26 can determine a relative position between the two diffraction gratings in the X direction (measurement direction) from an image of the moiré captured by the image sensor 25.

Figure 7C:
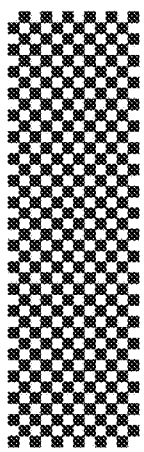
FIG. 7C is a diagram illustrating a checkerboard-like third diffraction grating.
Figure 7D:
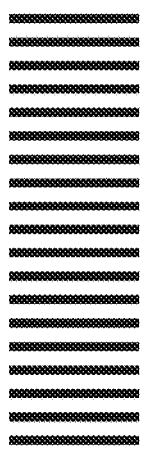
FIG. 7D is a diagram illustrating a fourth diffraction grating.

The light from the third and fourth poles IL3 and IL4 illustrated in FIG. 5 is not used for the measurement of the relative position between the diffraction gratings illustrated in FIGS. 7A and 7B. However, the light from the third and fourth poles IL3 and IL4 is used in detecting a relative position between diffraction gratings illustrated in FIGS. 7C and 7D. FIG. 7C illustrates a checkerboard-like third diffraction grating which is periodic both in the X direction and the Y direction orthogonal to the X direction. FIG. 7D illustrates a fourth diffraction grating which is periodic in the Y direction and has a period different from that of the third diffraction grating in the direction. The third diffraction grating is irradiated with the light from the third and fourth poles IL3 and IL4, obliquely incident in the X direction. The light is diffracted in the Y and X directions by the third diffraction grating, and diffracted in the Y direction by the fourth diffraction grating having a slightly different period. Such diffracted light carries relative position information about the third and fourth diffraction gratings in the direction. The diffracted light is incident on the detection area (NA$_O$) on the pupil plane of the detection optical system 21 illustrated in FIG. 5, and detected as a moiré by the image sensor 25. The processing unit 26 can determine a relative position between the third and fourth diffraction gratings in the Y direction (measurement direction) from an image of the moiré captured by the image sensor 25. The light from the first and second poles IL1 and IL2 is not used for the measurement of the relative position between the third and fourth diffraction gratings. In the present exemplary embodiment, the set of diffraction gratings illustrated in FIGS. 7A and 7B and the set of diffraction gratings illustrated in FIGS. 7C and 7D are arranged within the same field of view of the detection optical system 21 (image sensor 25) to simultaneously detect relative positions in the two directions (X and Y directions). In such a case, it is extremely effective to illuminate the four diffraction gratings with the light intensity distribution on the pupil plane of the illumination optical system 22 illustrated in FIG. 5.

Next, details of the alignment marks 10 and 11 for measuring a relative position between the mold 7 and the substrate 8 will be described. FIG. 8 is a diagram schematically illustrating an image of the light from the alignment marks 10 and 11 measured when the mold 7 and the substrate 8 are brought close to each other. The present exemplary embodiment uses diffraction grating marks for forming a moiré, a mold-side mark 51a-1 having a circular shape (fourth alignment mark), and a substrate-side mark 52a-1 having a triangular shape (third alignment mark). The alignment mark 10 includes the mold-side mark 51a-1. The alignment mark 11 includes the substrate-side mark 52a-1.

The measurement device 3 can measure (capture an image of) within the range of the outer frame illustrated in FIG. 8 by an imaging plane of one image sensor 25 at a time. In other words, a predetermined area to be imaged includes a plurality types of marks. However, the number of image sensors is not limited to one, and a plurality of image sensors may be used. The processing unit 26 of the measurement device 3 obtains an image of the mold-side mark 51a-1 and the substrate-side mark 52a-1 captured by the image sensor 25. Based on this image, the processing unit 26 then determines an amount of positional deviation D1 between the mold-side mark 51a-1 and the substrate-side mark 52a-1 (i.e., the mold 7 and the substrate 8) with reference to respective geometric center positions of the mold-side mark 51a-1 and the substrate-side mark 52a-1. The mold-side mark 51a-1 and the substrate-side mark 52a-1 are previously designed to be separated by a predetermined reference distance in the Y direction. Therefore, the difference between the reference distance and the amount of positional deviation D1 is a relative positional deviation between the mold-side mark 51a-1 and the substrate-side mark 52a-1.

The mold-side mark 51a-1 and the substrate-side mark 52a-1 can be reduced in size and thus occupy only a small area. The measurement accuracy of the relative position between the mold-side mark 51a-1 and the substrate-side mark 52a-1 is low (rough examination), compared with that of the relative position obtained by measuring a moiré produced by the diffraction gratings. The mold-side mark 51a-1 and the substrate-side mark 52a-1 may also have a difference in the amount of detected light depending on the reflectances of the marks 51a-1 and 52a-1. If the difference in the amount of light is large, the mold-side mark 51a-1 and the substrate-side mark 52a-1 are irradiated with light as bright as the mark of the smaller light amount can be detected. The signal of the mark of the larger light amount can then be saturated to cause a measurement error. Therefore, the difference between the amounts of light from the mold-side mark 51a-1 and the substrate-side mark 52a-1 needs to be suppressed.

There are also provided alignment marks of different type (material, shape, and/or thickness) from that of the mold-side mark 51a-1 and the substrate-side mark 52a-1. More specifically, a substrate-side diffraction grating 52a-2 (first alignment mark) and a mold-side diffraction grating 51a-2 (second alignment mark). The mold-side diffraction grating 51a-2 and the substrate-side diffraction grating 52a-2 overlap to produce a moiré pattern. Either one of the mold-side diffraction grating 51a-2 and the substrate-side diffraction grating 52a-2 has the periodic pattern illustrated in FIG. 7C. The other has the periodic pattern illustrated in FIG. 7D. Since the two patterns have slightly different periods in the measurement direction (Y direction), there arises a moiré pattern of which the light amount changes in the Y direction. As the mold-side diffraction grating 51a-2 and the substrate-side diffraction grating 52a-2 change in relative position, the moiré pattern moves. The amount of movement of the moiré pattern is greater than the amount of change in the relative position between the mold-side diffraction grating 51a-2 and the substrate-side diffraction grating 52a-2. The relative position between the mold-side diffraction grating 51a-2 and the substrate-side diffraction grating 52a-2 can thus be accurate measured (close examination), compared with the measurement accuracy of the relative position by using the mold-side mark 51a-1 and the substrate-side mark 52a-1.

As the mold-side diffraction grating 51a-2 and the substrate-side diffraction grating 52a-2 change in relative position, the moiré pattern (light amount distribution) moves in different directions depending on a relationship in magnitude between the periods of the mold-side diffraction grating 51a-2 and the substrate-side diffraction grating 52a-2. For example, if the period of the mold-side diffraction grating 51a-2 is greater than that of the substrate-side diffraction grating 52a-2, the moiré pattern shifts in a +Y direction as the substrate 8 shifts relatively in the +Y direction. On the other hand, if the period of the mold-side diffraction grating 51a-2 is smaller than that of the substrate-side diffraction grating 52a-2, the moiré pattern shifts in a −Y direction as the substrate 8 shifts relatively in the +Y direction. Therefore, the direction of the relative positional deviation between the mold-side diffraction grating 51a-2 and the substrate-side diffraction grating 52a-2 can thus be detected based on the shift direction of the moiré pattern and the relationship in magnitude between the periods of the mold-side diffraction grating 51a-2 and the substrate-side diffraction grating 52a-2.

There is also provided another set of diffraction gratings, i.e., a mold-side diffraction grating 51a-2' and a substrate-side diffraction grating 52a-2'. A relationship in magnitude between the periods of the mold-side diffraction grating 51a-2' and the substrate-side diffraction grating 52a-2' in the measurement direction is reverse to that of the mold-side diffraction grating 51a-2 and the substrate-side diffraction grating 52a-2. Therefore, if the mold 7 and the substrate 8 change in relative position, the two moiré patterns produced by the two sets of diffraction gratings move in opposite directions. Thus, by obtaining an amount of positional deviation D2 between the two moiré patterns, a relative position between the diffraction gratings can be measured with high accuracy.

As the amount of the relative positional deviation between a mold-side diffraction grating and a substrate-side diffraction grating increases, a moiré pattern arises periodically with the same light amount distribution. The measurement range of the relative position is as narrow as within the range of one period. By using the mold-side mark 51a-1 and the substrate-side mark 52a-1 having a wider measurement range, a relative positional deviation between the mold 7 and the substrate 8 over a range wider than one period can be obtained. In other words, by using the foregoing plurality of types of alignment marks a relative positional deviation between a portion of the mold 7 and a portion of the substrate 8 can be measured within the area captured by the image sensor 25. The mold-side mark 51a-1 and the substrate-side mark 52a-1 may be replaced with other diffraction gratings for producing a moiré pattern as long as the relative positional deviation obtained by detecting the light from the mold-side mark 51a-1 and the substrate-side mark 52a-1 does not produce a positional error corresponding to the foregoing one period. Such diffraction gratings may be of different material, shape, and/or thickness.

Next, the illumination light for illuminating the above-described alignment marks will be described. The reflectance of the alignment marks provided on the mold 7 and the substrate 8 varies with material, pattern shape, thickness, and a process structure of the substrate. The reflectance also varies with wavelength.

Figure 9:
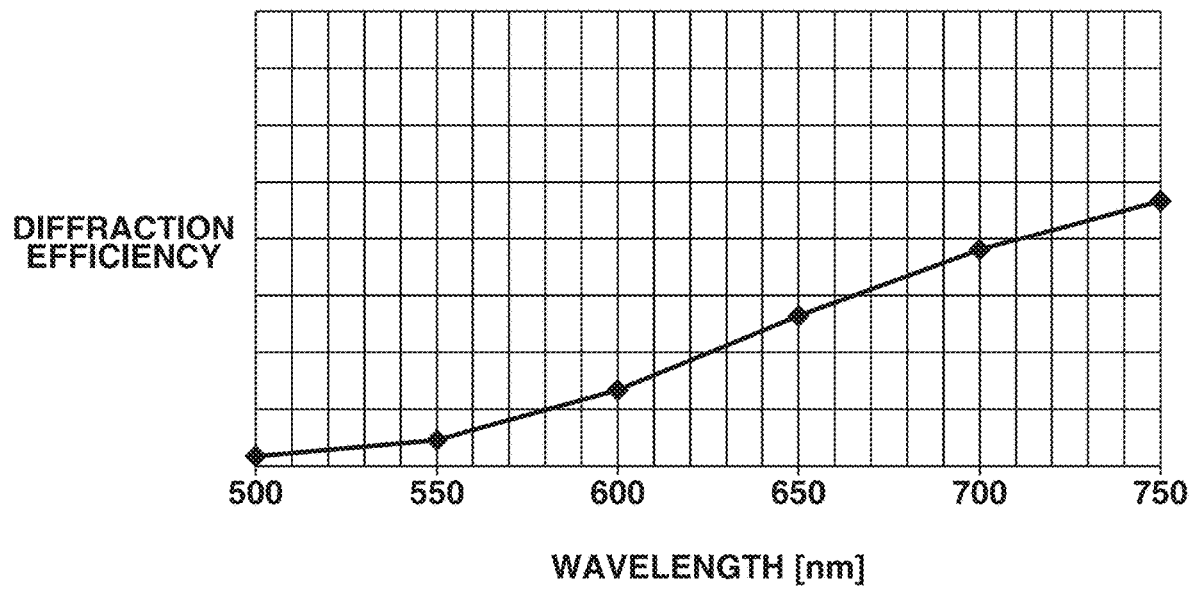
FIG. 9 is a graph illustrating an example of diffraction efficiency of a substrate-side mark.

FIG. 9 illustrates an example first-order diffraction efficiency of a mark on a wafer. This example shows the result of a simulation assuming a mark on a wafer that is configured in such a manner that a layer of a material S is formed on a previously-formed pattern for process formation. The layer of the material S lies on the pattern surface of the mark. Light that is transmitted through the layer of the material S, reflected by the pattern surface of the mark, and transmitted through the material S again is detected as first-order diffracted light. In such an example, the diffraction efficiency is low in the vicinity of 500 nm in wavelength, and high in the vicinity of 750 nm in wavelength. Contributing factors are the absorption of light by the material S and the thickness of the material S. Therefore, light having a wavelength in the vicinity of 750 nm is used to observe the mark on such a wafer.

Figure 10:
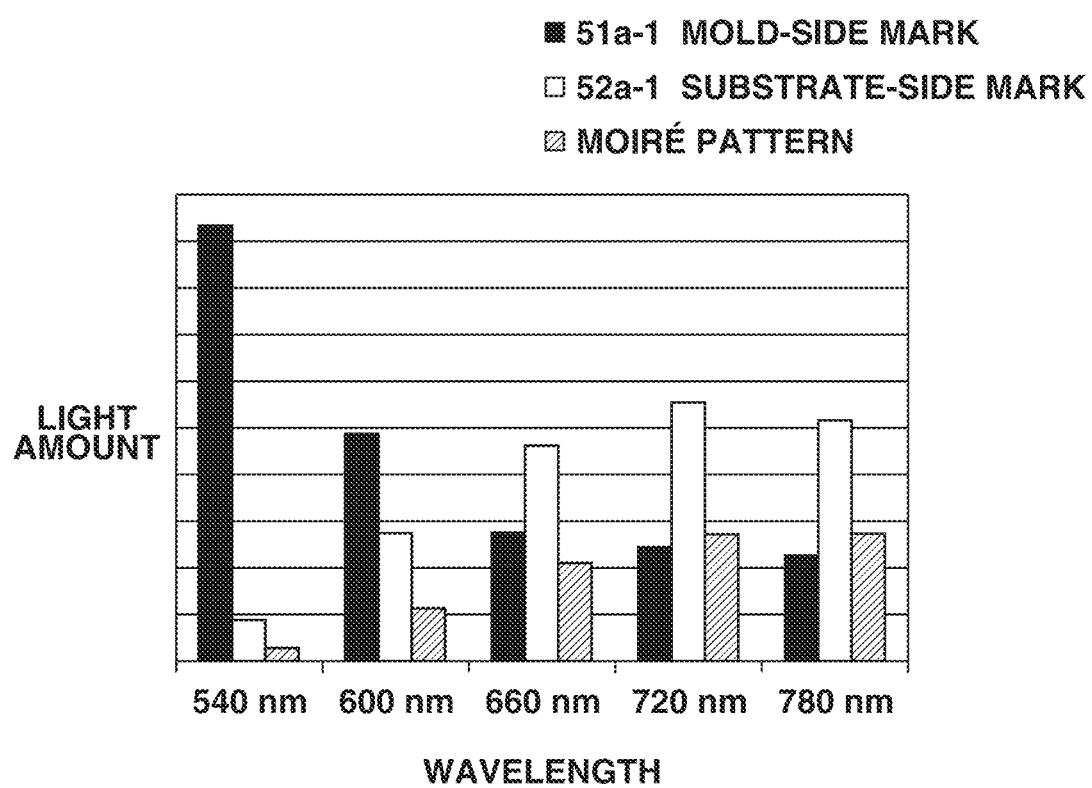
FIG. 10 is a graph illustrating examples of light amounts of light from marks.

FIG. 10 illustrates an example of the light amounts of light from the mold-side mark 51a-1, light from the substrate-side mark 52a-1, and a moiré pattern generated from the diffraction gratings 51a-2 and 52a-2. The light amount on the vertical axis indicates the light amounts of the light from the mold-side mark 51a-1 and the substrate-side mark 52a-1 when the marks 51a-1 and 52a-1 are illuminated with the same amount of light. For the moiré pattern, the light amount indicates the maximum light amount of the moiré pattern. The moiré pattern is a light amount distribution including information about the relative position between the mold-side diffraction grating 51a-2 and the substrate-side diffraction grating 52a-2. Noise light generated at the ends of the mold-side diffraction grating 51a-2 and the substrate-side diffraction grating 52a-2 is not included. In FIG. 10, the light amount of the mold-side mark 51a-1 is high in the vicinity of 540 nm in wavelength and low in the vicinity of 780 nm in wavelength. The light amount of the substrate-side mark 52a-1 is recognized to be low in the vicinity of 540 nm in wavelength and becomes maximum in the vicinity of 720 nm in wavelength. The light amount of the moiré pattern is recognized to be low in the vicinity of 540 nm in wavelength and become maximum in the vicinity of 720 nm in wavelength.

At a wavelength of 540 nm, the light amount of the light from the mold-side mark 51a-1 is high, and the light amount of the light from the substrate-side mark 52a-1 and that of the moiré pattern are relatively low. Therefore, the light from the substrate-side mark 52a-1 and the moiré pattern have a low contrast (signal-to-noise (S/N) ratio) and may cause a decrease in the detection accuracy when detected by the image sensor 25. Therefore, illuminating such alignment marks, light having wavelengths in the vicinity of 540 nm in the illumination light may be reduced. For that purpose, the output energy (light amount) of a light source or sources that emit light in the vicinity of 540 nm in wavelength among the plurality of light sources 30a to 30d is reduced.

Then, a relative value between the light amount from the mold-side mark 51a-1, the light amount from the substrate-side mark 52a-1, and the light amount of the moiré pattern detected by the image sensor 25 is adjusted to fall within a predetermined range. The adjustment may be made by adjusting the light amounts of light of a plurality of wavelengths (first wavelength and second wavelength) emitted from the light source 23. Here, the predetermined range refers to roughly the same light amounts. The reason is that if a light amount difference between the marks is large, the measurement signal of a type of mark can be saturated when the marks are detected by the image sensor 25. The measurement signals of other types of marks then become unable to be detected, and the relative positions between the marks become difficult to detect with high accuracy. If a light amount difference between the marks is large under illumination light of a single wavelength, a light amount difference between the marks under illumination light of another wavelength can be added to reduce the light amount difference between the marks. In particular, a relative amount between the light amount of the first wavelength and the light amount of light having the second wavelength may be adjusted so that a relative value between the light amount from the mold-side mark 51a-1 or the light amount from the substrate-side mark 52a-1 and the light amount of the moiré pattern, detected by the image sensor 25, falls within a predetermined range. If light sources having different wavelength bands are used as the light sources 30a to 30d, the control unit 37 (adjustment unit) individually adjusts the amounts of light (output energy) emitted from the light sources 30a to 30d to adjust relative light amounts between the plurality of wavelengths of the light source 23 so that a difference in the detected amount of light between the marks decreases. In some cases, the control unit 37 (adjustment unit) may stop the output of a light source of a certain wavelength. In other words, the control unit 37 (adjustment unit) adjusts a relative amount between the light amount of the light having the first wavelength emitted from the first light source and the light amount of the light having the second wavelength emitted from the second light source. As described above, ND filters (adjustment unit) arranged in the optical paths of the respective light sources 30a to 30d may be used to adjust the relative amount between the light amount of the light having the first wavelength emitted from the first light source and the light amount of the light having the second wavelength emitted from the second light source. As employed herein, a relative amount between light amounts refers to a relative difference between the light amounts, such as a light amount difference and a light amount ratio. To change the light amounts of the light from the mold-side mark and the substrate-side mark by equal amounts, the ND filter 34 arranged in the optical path after the combination of the light of the plurality of wavelengths may be used to control the light amounts to desired ones. Further, both the light sources 30a to 30d and the ND filter 34 may be controlled for light amount adjustment.

Figure 11:
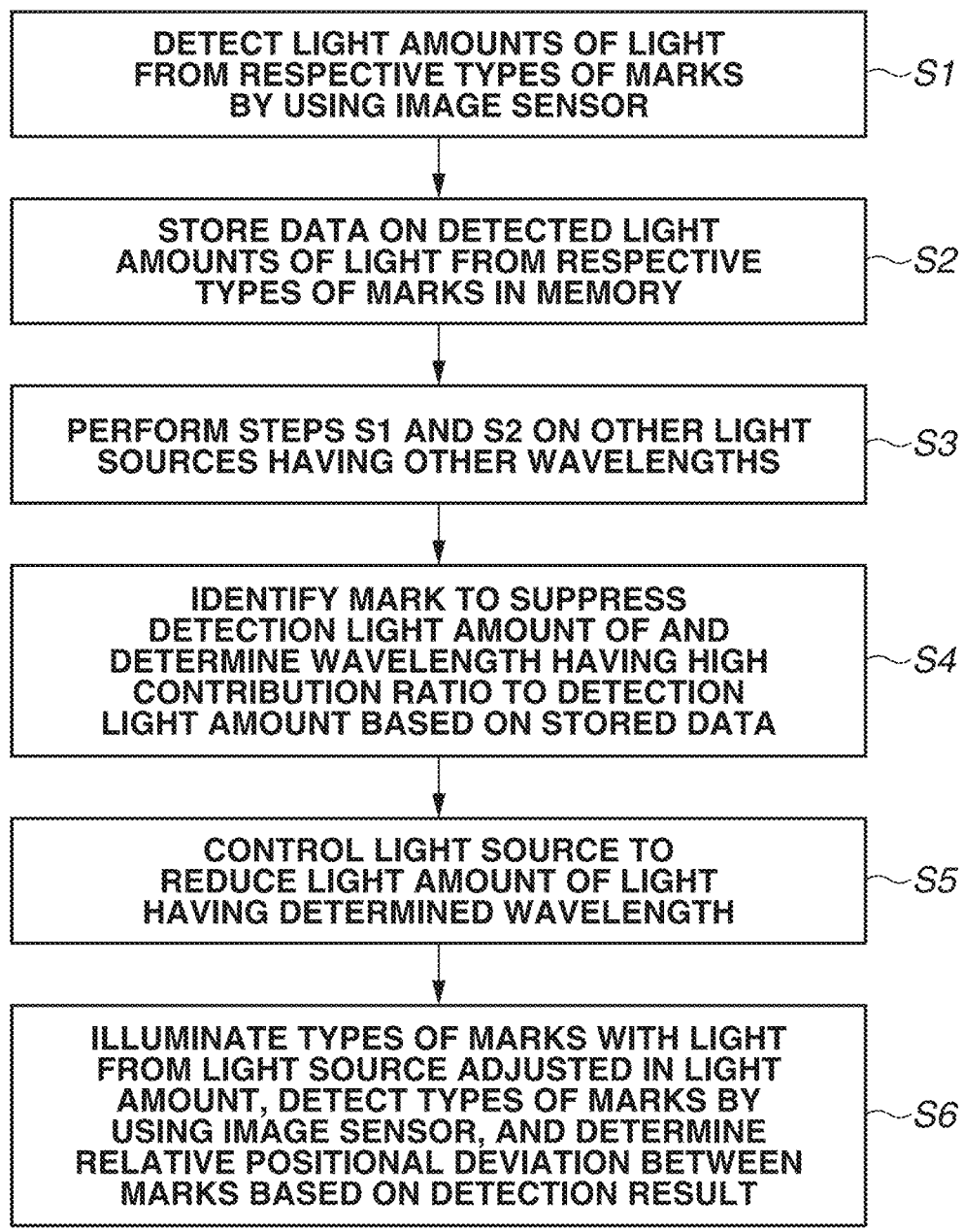
FIG. 11 is a flowchart illustrating a method for adjusting the light amount of light from the light source.

Next, a method for adjusting the light amount of the light from the light source 23 will be described. FIG. 11 illustrates a flowchart of the method for adjusting the light amount of the light from the light source 23. The light amount adjustment is performed according to the marks formed on the mold 7 and the substrate 8 since a light amount difference between the marks varies with the types and combinations of the plurality of marks formed on the mold 7 and the substrate 8.

In step S1, the plurality of light sources 30a to 30d but one is initially turned off, or light from other than the one light source is blocked. The plurality of types of marks provided on the mold 7 and the substrate 8 are illuminated with only light having a first wavelength from the one light source. The image sensor 25 detects the light amounts of light from the respective plurality of types of marks. In step S2, data on the light amounts of the respective plurality of types of marks detected by the image sensor 25 is stored into a memory of the processing unit 26 connected to the image sensor 25. In step S3, processing in steps S1 and S2 is performed on the other light sources such as one having a second wavelength different from the first wavelength. In such a manner, the contribution ratios of respective wavelengths to the light amounts of the light from the respective marks detected when the marks are illuminated by all the light sources 30a to 30d (plurality of wavelengths) can be found out. In step S4, a mark to suppress the detection light amount of is identified and a wavelength having a high contribution ratio to the detection light amount is determined based on the data stored in the memory. In step S5, the control unit 37 controls the light source 23 so as to reduce the light amount of light having the determined wavelength. At that time, the control unit 37 may adjust the emission light amounts of light sources in descending order of the contribution ratio to the detection light amount. The processing in steps S1 to S5 may be automatically controlled by the control unit 12.

A goal of the light amount adjustment is, for example, that a light amount difference between the mold-side mark 51a-1 and the substrate-side mark 52a-1 falls within a predetermined specification value (allowable range). That the light amounts of the respective marks 51a-1 and 52a-1 are not weak may be added as an additional goal. An example of the specification value about the light amount difference between the mold-side mark 51a-1 and the substrate-side mark 52a-1 is four times in terms of the light amount ratio between the mold-side mark 51a-1 and the substrate-side mark 52a-1. A range in which the light amounts of the light from the respective marks 51a-1 and 52a-1 are not weak refers to one capable of detection by the image sensor 25. An example of such a range is greater than or equal to 40% of the maximum light amount detectable by the image sensor 25. In other words, in steps S4 and S5, target light amounts of the first wavelength and the second wavelength are determined. The target light amounts are determined so that relative values between the detection light amount of the light from the diffraction gratings 51a-2 and 52a-2 and the detection light amounts of the light from the mold-side mark 51a-1 and the substrate-side mark 52a-1 detected by the image sensor 25 fall within a predetermined range. The target light amounts are also determined based on the maximum light amount detectable by the image sensor 25. Then, the light amount of the light of the first wavelength and the light amount of the light of the second wavelength are adjusted to the determined target light amounts.

A light amount difference between the marks is determined by the types and combinations of the marks provided on the mold 7 and the substrate 8. Therefore, data on the light amounts of the plurality of types of marks or the contribution ratios of the wavelengths to the light amounts from the marks may be obtained with respect to each type of mold 7 and each type of substrate 8, and stored in the memory as a database in advance. In actual measurement, relative light amounts between the plurality of wavelengths of the light source 23 are adjusted based on the type of the mold 7, the type of the substrate 8, and the database thereof so that a relative value between the detection light amounts of the marks falls within the predetermined range. The database may store a relationship between the type of the mold 7, the type of the substrate 8, and the relative light amounts between the plurality of wavelengths of the light source 23.

After the above-described light amount adjustment, in step S6, the plurality of types of marks is illuminated with the light from the light source 23 adjusted in light amount. The image sensor 25 detects the plurality of types of marks. A relative positional deviation between the marks is obtained based on the detection result. In other words, the first alignment mark provided on the substrate 8 and the second alignment mark provided on the mold 7 are illuminated with illumination light including illumination light having the first wavelength and illumination light having the second wavelength different from the first wavelength. The third alignment mark, which is provided on the substrate 8 and different from the first alignment mark, and the fourth alignment mark, which is provided on the mold 7 and different from the second alignment mark, are illuminated with the illumination light including the illumination light having the first wavelength and the illumination light having the second wavelength. The light from the first and second alignment marks and the light from the third and fourth alignment marks, illuminated with the illumination light, are detected by the image sensor 25. A relative position between the first and second alignment marks is obtained based on the detected light from the first and second alignment marks. A relative position between the third and fourth alignment marks is obtained based on the detected light from the third and fourth alignment marks.

As illustrated in FIG. 10, the wavelength characteristics of the light amounts of the light from the marks differ depending on the types of marks. Accordingly, it is known that the marks may be illuminated and detected with light of suitable wavelengths. The light amount of the moiré pattern is high at wavelengths of 720 nm and 780 nm. Therefore, for the diffraction gratings 51a-2 and 52a-2 that produce the moiré pattern, light in the vicinity of 720 to 780 nm in wavelength where the light amount is high may be detected. The diffraction gratings 51a-2 and 52a-2 may be illuminated with only the light in the vicinity of 720 to 780 nm in wavelength. The diffraction gratings 51a-2 and 52a-2 may be illuminated with a wider wavelength band of light, and only the light in the vicinity of 720 nm to 780 nm in wavelength from the diffraction gratings 51a-2 and 52a-2 may be detected. The light amount of the mold-side mark 51a-1 decreases as the wavelength shifts from 540 nm to 780 nm. The light amount of the substrate-side mark 52a-1 is low in the vicinity of 540 nm in wavelength, and peaks at around 720 nm in wavelength. To detect the mold-side mark 51a-1 and the substrate-side mark 52a-1 with equivalent light amounts, light having a wavelength of 600 to 660 nm, which is shorter than 720 to 780 nm, can be detected. The mold-side mark 51a-1 and the substrate-side mark 52a-1 may be illuminated with only the light having a wavelength of 600 to 660 nm. The mold-side mark 51a-1 and the substrate-side mark 52a-1 may be illuminated with a wider wavelength band of light, and only the light having a wavelength of 600 to 660 nm from the mold-side mark 51a-1 and the substrate-side mark 52a-1 may be detected.

For example, only a light source or sources that emit light having a wavelength of 720 nm or 780 nm among the plurality of light sources 30a to 30d are turned on to illuminate the diffraction gratings 51a-2 and 52a-2. A moiré pattern from the diffraction gratings 51a-2 and 52a-2 is detected by the image sensor 25. Then, a relative position between the diffraction gratings 51a-2 and 52a-2 (substrate 8 and mold 7) is determined. Only a light source or sources that emit light having a wavelength of 600 to 660 nm among the plurality of light sources 30a to 30d are turned on to illuminate the mold-side mark 51a-1 and the substrate-side mark 52a-1. Light from the mold-side mark 51a-1 and the substrate-side mark 52a-1 is detected by the image sensor 25. Then, a relative position between the mold-side mark 51a-1 and the substrate-side mark 52a-1 is obtained. The marks may be either simultaneously illuminated or alternately illuminated at different times. If the marks are simultaneously illuminated, the light from the marks may be either simultaneously detected or alternately detected at different times. Further, the light amount adjustment is not limited to be performed on the illumination unit side. The marks may be illuminated by using illumination light of a wider wavelength band, and an ND filter or filters on the detection unit side may be used to adjust the light amount of light having the wavelength to be detected by the image sensor 25.

As described above, according to the present exemplary embodiment, the detected relative value between the light amounts of the marks falls within a predetermined range. Therefore, a relative position between the marks can be accurately obtained from the detection result of the plurality of types of marks.

In the above description, the light amount of the light emitted from the light source 23 at each wavelength is adjusted inside the light source 23. However, the light amount adjustment is not limited thereto, and may be performed an the detection unit side. For example, a color filter or filters may be provided on the detection unit side, and a relative value between the detection light amounts detected by the image sensor 25 at the respective wavelengths may be adjusted by using the color filter(s). The light from the marks may be branched by dichroic mirrors wavelength by wavelength, and made incident on a plurality of sensors via ND filters so that the sensors detect the light of the respective wavelength. The transmitted light amounts of the ND filters may be changed to adjust a relative value between the detection light amounts of the light of the respective wavelengths detected by the sensors.

In a second exemplary embodiment, an intensity of noise light is employed as a target in adjusting the light amounts of respective wavelengths in the light source. There may desirably be no noise light. However, at some wavelengths of illumination light, noise (N) can be higher than the measurement signals (S) from the marks. If there is a large amount of noise, an error of the measurement of the relative position between the marks may occur. The light amounts are then adjusted to reduce noise.

Figure 12:
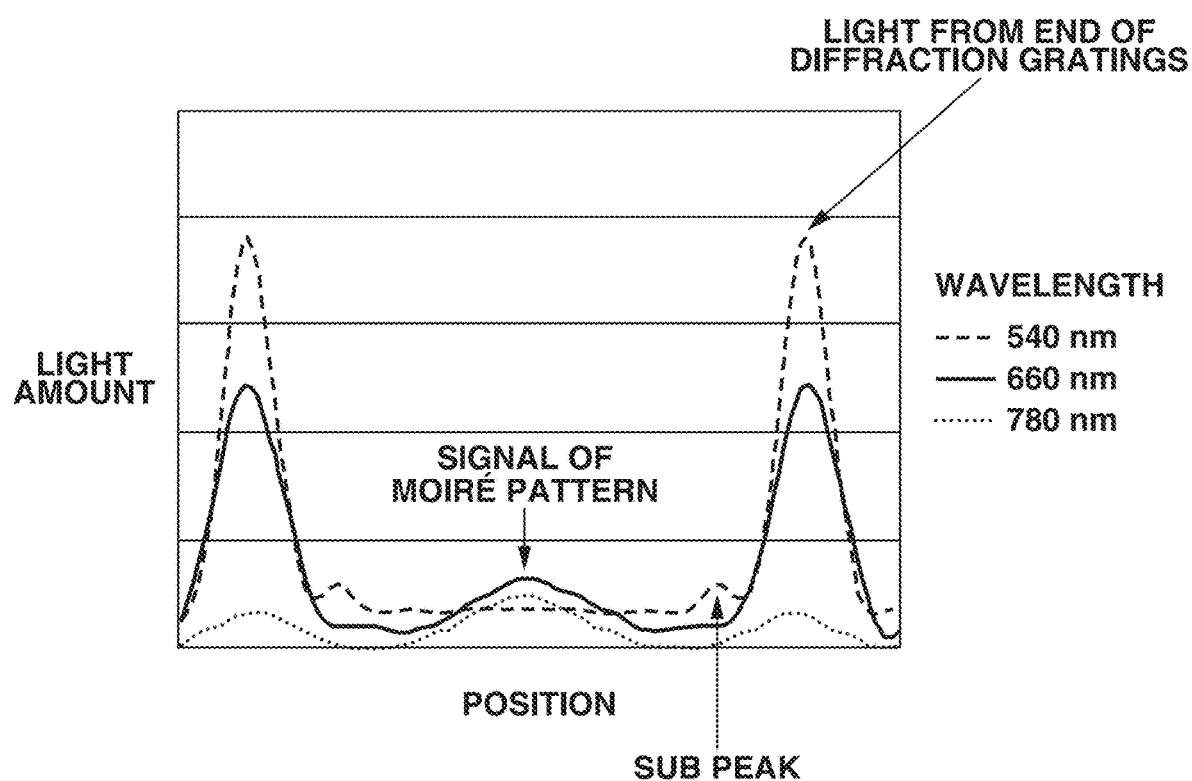
FIG. 12 is a graph illustrating simulated waveforms of the light amount of light from diffraction gratings.

An influence of the light from poles that are not used to measure the relative position between the diffraction gratings illustrated in FIGS. 7A and 7B will be described. For example, the light from the third and fourth poles 113 and 114 illustrated in FIG. 5 causes scattering and diffraction on the set of diffraction gratings illustrated in FIGS. 7A and 7B, at the ends in the period direction of the diffraction gratings (both ends of the diffraction grating patterns). FIG. 12 illustrates a measurement signal of the light from the diffraction gratings, including a moiré, obtained by optical simulations under possible conditions of the mold 8 and the wafer 7 when the diffraction gratings are illuminated with the first to fourth poles IL1 to IL4. FIG. 12 illustrates light amount distributions of the light from the diffraction gratings, including a moiré, when the diffraction gratings are illuminated at wavelengths of 540 nm, 660 nm, and 780 nm, respectively. The horizontal axis indicates the position on the diffraction gratings. Peripheral positions away from the center correspond to the ends of the diffraction gratings in the period direction. The vertical axis indicates the light mount of the light from the diffraction gratings in a case where the diffraction gratings are illuminated with the same light amount of light at each wavelength. If the diffraction gratings are illuminated at a wavelength of 540 nm, the light amount produces high peaks near both ends of the diffraction grating patterns. There are also small sub peaks. These peaks are ascribable to light generated from the discontinuation of the continuous patterns (grating condition) of the diffraction gratings at the ends. Such a phenomenon also occurs when the diffraction gratings are detected in a bright field of view, whereas the phenomenon is particularly noticeable when the diffraction gratings are detected in a dark field of view. If the light occurring at both ends of the diffraction grating patterns or the light of the sub peaks mixes into a moiré signal, an error occurs during the detection of the moiré signal that contains information about the relative position between the diffraction gratings. It is known that the wavelength of 540 nm produces hardly any ups and downs in the waveform of the moiré pattern containing the information about the relative position between the diffraction gratings. In other words, since the light having a wavelength of 540 nm acts only as noise, and it may desirable not to use in detecting a moiré pattern. If the diffraction gratings are illuminated with light having a wavelength of 660 nm, the light amount also peaks at the ends of the diffraction gratings, whereas some ups and downs of the moiré signal are observed. If the diffraction gratings are illuminated with light having a wavelength of 780 nm, it can be seen that the light amount at the ends of the diffraction gratins is lower than that of the moiré signal. As described above, in measuring the relative position between the diffraction gratings, the light amount distribution of the light from the diffraction gratings differs depending an the wavelength. The magnitude of the noise component also varies with the wavelength.

Accordingly, the control unit 37 controls the light source 23 to reduce the light amount of the light having a wavelength of 540 nm, which produces noise light, among the lights for illuminating the gratings, whereby noise light from the diffraction gratings is reduced. The control unit 37 adjusts the light amounts of the respective wavelengths to reduce noise light at the ends of the diffraction gratings within such a range that the detection light amounts of t e light from the mold-side mark 51a-1 and the substrate-side mark 52a-1 and the moiré pattern are secured and the light amount ratio between the marks does not reach or exceed four times.

Data on the light amount of the noise light (noise light amount) at the ends of the diffraction gratings may be stored in the memory as a target of light amount adjustment in addition to the detection light amounts of the marks, so that the above-described light amount adjustment can be performed based on the stored data. If the light amount of light having a specific wavelength is reduced to reduce the noise light amount, the light amount of the moiré pattern may also decrease. If the light amount of the moiré pattern decreases more than the noise light amount does, a measurement error may increase. To take a simple example, in a case where the light amount at the ends of the diffraction gratings is twice or more that of the moiré pattern, it is determined that the light amount peaks at the ends of the diffraction gratings. Since "the light amount at the ends of the diffraction gratings=the light amount of the moiré pattern+the noise light amount", the noise light amount at the ends of the diffraction gratings is greater than the light amount of the moiré pattern. Accordingly, the light amounts of the light source 23 at respective wavelengths are adjusted so that the detection light amount of the light detected at the ends of the diffraction gratings becomes smaller than twice the detection light amount of the light from the central part of the diffraction gratings. In such a manner, a measurement error of the relative position between the marks can be reduced by reducing the light amount of light having a wavelength at which an impact on the noise light is greater than a contribution to the light amount of the moiré pattern.

As described above, according to the present exemplary embodiment, the effect of the noise light from the ends of the diffraction gratings is reduced, and a relative amount between the detection light amount of the rough examination marks and that of the diffraction gratings, or close examination marks, is reduced. Thus, a relative position between the marks can be accurately detected from the detection result of the marks.

Figure 13:
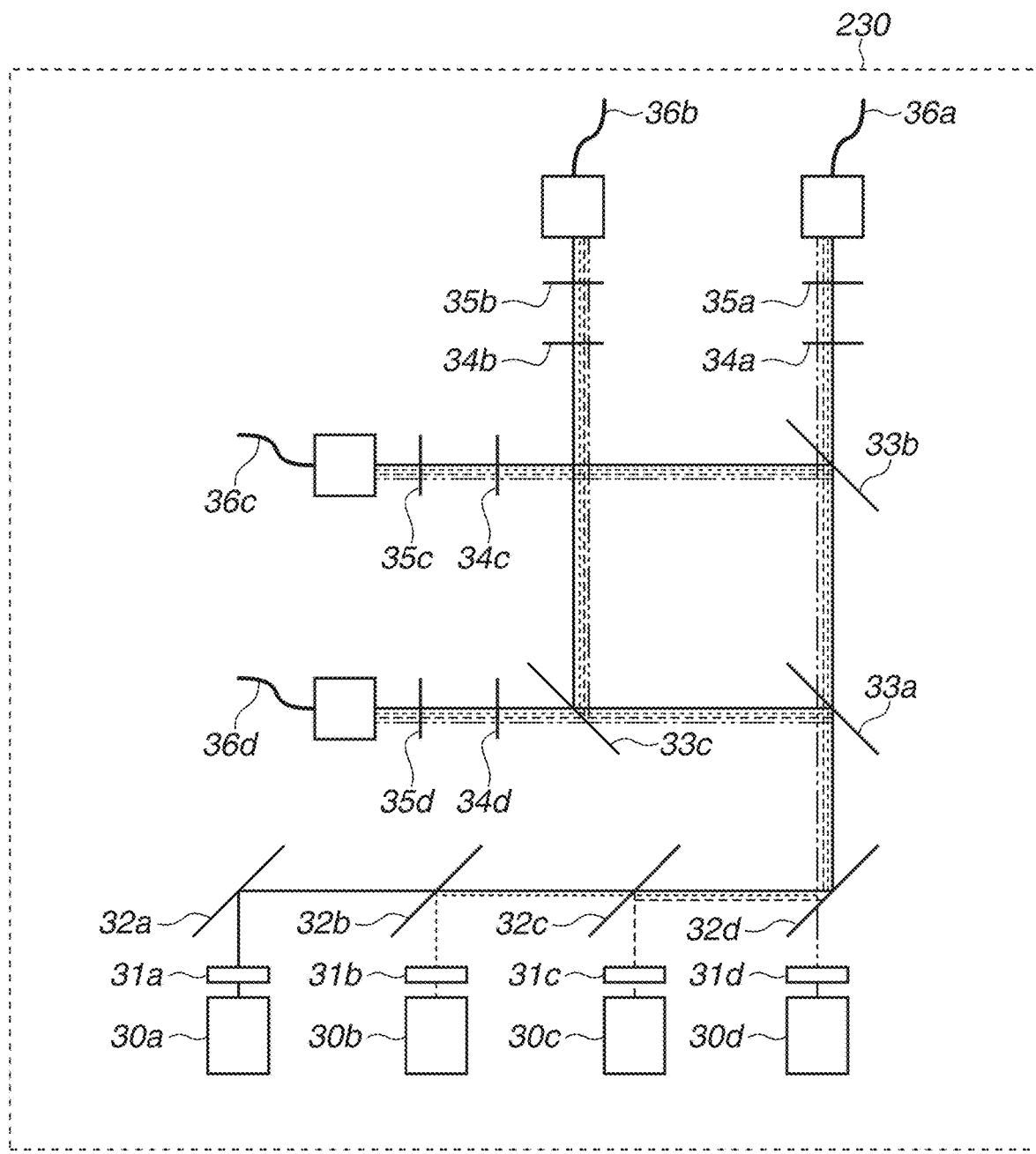
FIG. 13 is a diagram illustrating a modification of the configuration of the light source.

In the first exemplary embodiment, one light source 23 is configured to emit light from one fiber 36 to one measurement device 3. In a third exemplary embodiment, one light source 230 emits light to a plurality of measurement devices 3 via a plurality of fibers. As illustrated in FIG. 13, the light source 230 includes half mirrors 33a, 33b, and 33c arranged in optical paths to branch the optical paths. The branched light beams are made incident on fibers 36a, 36b, 36c, and 36d to generate four light source beams, respectively. For example, the light emitted from the fiber 36a can be used as the light of the light source 23 of a first measurement device. The light emitted from the fiber 36h can be used as the light of the light source 23 of another measurement device. An ND filter 34a and a diffusion plate 35a are arranged in the optical path between the half mirror 33b and the fiber 36a. An ND filter 34b and a diffusion plate 35b are arranged in the optical path between the half mirror 33c and the fiber 36b. An ND filter 34c and a diffusion plate 35c are arranged in the optical path between the half mirror 33b and the fiber 36c. An ND filter 34d and a diffusion plate 35d are arranged in the optical path between the half mirror 33c and the fiber 36d. As a result, the light amounts of the light for the respective light sources can be adjusted, and speckle noise can be reduced.

If a plurality of measurement devices is thus used to measure a relative position between the substrate 8 and the mold 7, a relative position between the marks can be measured at a plurality of separate locations, for example, at four corners (four areas) of the shot area of the substrate 8. From the measurement results, the rotation of the mold 7 and/or the substrate 8 and distortion of magnification can be obtained. If alignment is performed to reduce a relative positional deviation between the marks at each of the four areas, the substrate pattern and the mold pattern can be accurately registered over the entire shot area. FIG. 13 illustrates a case of using three branching units, whereas the number of branching units is not limited thereto.

A fourth exemplary embodiment will be described. A pattern of a cured article formed by using an imprint apparatus is used permanently as at least part of various products, or temporarily in manufacturing various products. Examples of the products include an electric circuit element, an optical element, MEMS, a recording element, a sensor, and a mold. Examples of the electric circuit element include volatile and nonvolatile semiconductor memories such as a dynamic random access memory (DRAM), a static random access memory (SRAM), a flash memory, and a magnetoresistive random access memory (MRAM), and semiconductor elements such as a large scale integrated circuit (LSI), a CCD, an image sensor, and a field-programmable gate array (FPGA). Examples of the mold include a mold for imprinting.

The pattern of the cured article is used either simply at least a component of the product or temporarily as a resist mask. The resist mask is removed after etching or ion injection in a substrate processing step.

Figure 14A:
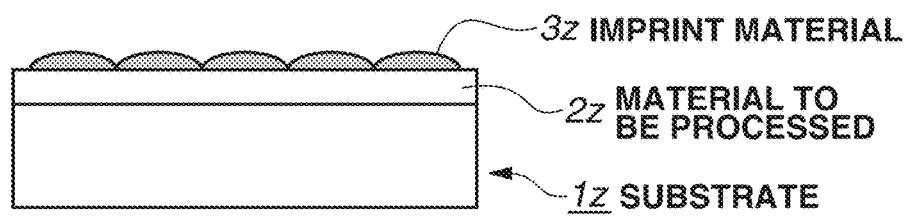
FIG. 14A is a diagram illustrating a substrate to which an imprint material is applied.

Next, a specific method for manufacturing a product will be described. As illustrated in FIG. 14A, a substrate 1z, such as a silicon wafer, having a material to be processed 2z, such as an insulator, formed on its surface is prepared. An imprint material 3z is then applied to the surface of the material to be processed 2b by inkjet printing. FIG. 14A illustrates a state in which a plurality of droplets of the imprint material 3z is applied onto the substrate 1z.

Figure 14B:
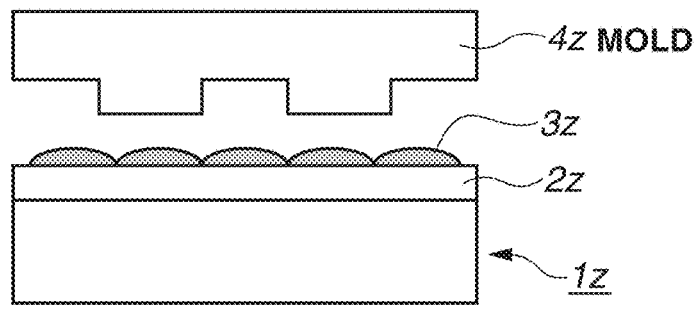
FIG. 14B is a diagram illustrating a state in which a mold and the imprint material are opposed to each other.
Figure 14C:
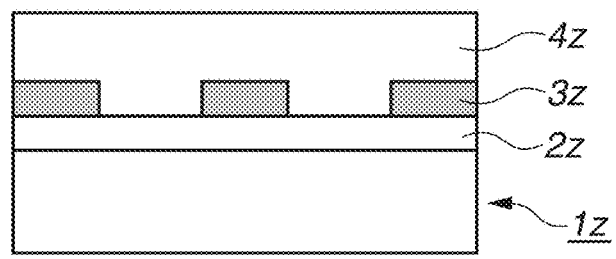
FIG. 14C is a diagram illustrating stamping and curing.

As illustrated in FIG. 14B, the concave and convex-patterned side of a mold 4z for imprinting is opposed to the imprint material 3z on the substrate 1z. As illustrated in FIG. 14C, the substrate 1z, to which the imprint material 3z is applied, and the mold 4z are brought into contact and pressurized. The imprint material 3z fills the gaps between the mold 4z and the material to be processed 2z. In such a state, the imprint material 3z is irradiated with light serving as curing energy through the mold 4z, whereby the imprint material 3z cures.

Figure 14D:
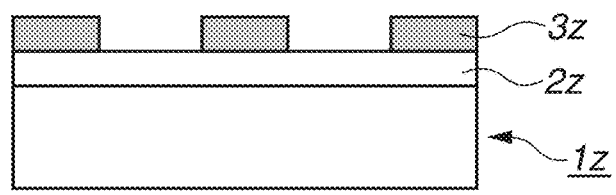
FIG. 14D is a diagram illustrating a pattern of the imprint material.

As illustrated in FIG. 14D, after the curing of the imprint material 3z, the mold 4z and the substrate 1z are separated, whereby a pattern of the cured article of the imprint material 3z is formed on the substrate 1z. The pattern of the cured article has a shape such that the recesses of the mold 4z correspond to the protrusions of the cured article, and the protrusions of the mold 4z to the recesses of the cured article. In other words, the concave and convex pattern of the mold 4z is transferred to the imprint material 3z.

Figure 14E:
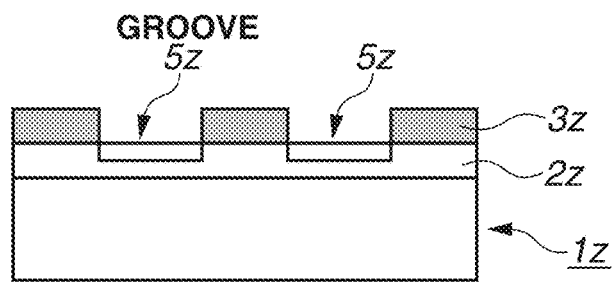
FIG. 14E is a diagram illustrating etching.
Figure 14F:
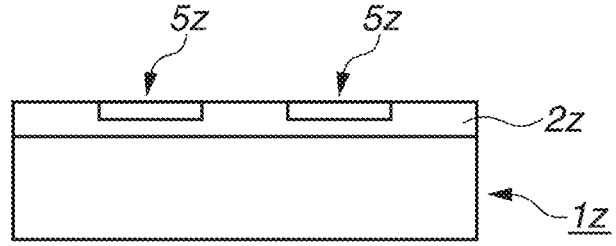
FIG. 14F is a diagram illustrating a pattern formed on the substrate.

As illustrated in FIG. 14E, etching is performed with the pattern of the cured article as an etching resist mask. The surface of the material to be processed 2z where there is no cured article or there remains only a thin layer of the cured article is removed to form grooves 5z. As illustrated in FIG. 14F, when the pattern of the cured article is removed, a product having the grooves 5z formed in the surface of the material to be processed 2z can be obtained. While the pattern of the cured article is removed, the pattern of the cured article may be left unremoved after the process. For example, such a pattern of the cured article may be used as an interlayer insulation film included in a semiconductor element, i.e., as a component of the product.

The exemplary embodiments of the disclosure have been described above. However, the disclosure is not limited to such exemplary embodiments, and various changes and modifications may be made without departing from the gist thereof. For example, the apparatus to which the above-described measurement device 3 is applied is not limited to an imprint apparatus. The measurement device 3 may be applied to lithography apparatuses for forming a pattern in general.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-087314, filed Apr. 25, 2016, which is hereby incorporated by reference herein in its entirety.

What is claimed is:

1. A measurement device comprising:
an illumination unit configured to comprise a first light source for emitting illumination light having a first wavelength and a second light source for emitting illumination light having a second wavelength, and configured to illuminate a first alignment mark provided on a first member, a second alignment mark provided on a second member, illuminate a third alignment mark provided on the first member and a fourth alignment mark provided on the second member by the illumination light having the first wavelength and the illumination light having the second wavelength;
a detection unit configured to detect first light output from the first alignment mark and output from the second alignment mark after the first alignment mark when the illumination light having the first wavelength and the illumination light having the second wavelength are incident on the second alignment mark and incident on the first alignment mark after the second alignment mark and configured to detect second light output from the third alignment mark and output from the fourth alignment mark after the third alignment mark when the illumination light having the first wavelength and the illumination light having the second wavelength are incident on the fourth alignment mark and incident on the third alignment mark after the fourth alignment mark;

a processing unit configured to obtain a relative position between the first and second alignment marks based on the detected first light, and a relative position between the third and fourth alignment marks based on the detected second light; and an adjustment unit configured to adjust a light amount of illumination light having the first wavelength and a light amount of illumination light having the second wavelength for illuminating the first alignment mark, the second alignment mark, the third alignment mark, and the fourth alignment mark so that a relative value between a detection light amount of the first light detected by the detection unit and a detection light amount of the second light detected by the detection unit falls within a predetermined range.

2. The measurement device according to claim 1,
wherein the adjustment unit includes a changing unit configured to change output energy of a first light source configured to emit the illumination light having the first wavelength and a second light source configured to emit the illumination light having the second wavelength, and wherein the adjustment unit is configured to control the changing unit to adjust a light amount of the illumination light having the first wavelength emitted from the first light source and a light amount of the illumination light having the second wavelength emitted from the second light source.

3. The measurement device according to claim 1, wherein the adjustment unit is configured to adjust the relative amount between the light amount of illumination light having the first wavelength and the light amount of illumination light having the second wavelength so that a detection light amount of the light from the third alignment mark and a detection light amount of the light from the fourth alignment mark detected by the detection unit falls within a predetermined range.

4. The measurement device according to claim 1,
wherein the detection unit includes an image sensor configured to obtain an image of an alignment mark, and wherein an image of the first, second, third, and fourth alignment marks is obtained by an imaging plane of the image sensor.

5. The measurement device according to claim 1, wherein measurement accuracy of the relative position between the first and second alignment marks obtained by detecting the first light is higher than that of the relative position between the third and fourth alignment marks obtained by detecting the second light.

6. The measurement device according to claim 1, wherein the first alignment mark is a first diffraction grating having a period in both a first direction and a second direction, and the second alignment mark is a second diffraction grating having a period in the second direction, the period of the second diffraction grating being different from that of the first diffraction grating in the second direction.

7. The measurement device according to claim 6,
wherein the detection unit includes an image sensor configured to obtain an image of an alignment mark, and wherein the image sensor is configured to obtain an image of a moiré pattern produced by the first and second diffraction gratings, an image of the third alignment mark, and an image of the fourth alignment mark.

8. The measurement device according to claim 7, wherein the adjustment unit is configured to adjust the relative amount between the light amount of illumination light having the first wavelength and the light amount of illumination light having the second wavelength so that a detection light amount of light from an end of the first and second diffraction gratings detected by the detection unit is smaller than twice a detection light amount of light from a central part of the first and second diffraction gratings.

9. The measurement device according to claim 1, further comprising a control unit configured to determine a target light amount of the illumination light having the first wavelength and a target light amount of the illumination light having the second wavelength so that the relative value between the detection light amount of the first light and the detection light amount of the second light detected by the detection unit falls within the predetermined range, and wherein the adjustment unit is configured to adjust a light amount of the illumination light having the first wavelength and a light amount of the illumination light having the second wavelength to the determined respective target light amounts.

10. The measurement device according to claim 1, wherein the adjustment unit is configured to adjust the relative amount between the light amount of illumination light having the first wavelength and the light amount of illumination light having the second wavelength so that the detection light amount of the first light and the detection light amount of the second light detected by the detection unit are greater than or equal to 40% of a maximum light amount detectable by the detection unit.

* * * * *